(12) United States Patent
Ku et al.

(10) Patent No.: US 8,759,165 B2
(45) Date of Patent: Jun. 24, 2014

(54) MANUFACTURING METHOD OF ARRAY SUBSTRATE

(71) Applicant: AU Optronics Corp., Hsin-Chu (TW)

(72) Inventors: Hui-Ling Ku, Hsin-Chu (TW); Chia-Yu Chen, Hsin-Chu (TW); Yi-Chen Chung, Hsin-Chu (TW); Yu-Hung Chen, Hsin-Chu (TW); Chi-Wei Chou, Hsin-Chu (TW); Fan-Wei Chang, Hsin-Chu (TW); Hsueh-Hsing Lu, Hsin-Chu (TW); Hung-Che Ting, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/155,380

(22) Filed: Jan. 15, 2014

(65) Prior Publication Data
US 2014/0127844 A1    May 8, 2014

Related U.S. Application Data

(62) Division of application No. 13/668,332, filed on Nov. 5, 2012, now Pat. No. 8,674,365.

(30) Foreign Application Priority Data

Dec. 22, 2011  (TW) .............................. 100148074 A
Mar. 27, 2012  (TW) .............................. 101110547 A

(51) Int. Cl.
*H01L 21/00*    (2006.01)
*H01L 21/84*    (2006.01)

(52) U.S. Cl.
USPC  438/149; 438/151; 438/E21.32; 438/E21.561; 438/E21.7

(58) Field of Classification Search
CPC ........................ H01L 29/4908; H01L 27/1214
USPC .............. 257/48, 128, 149, 151, 157, E21.32, 257/E21.561, E21.7
See application file for complete search history.

(56) References Cited

U.S. PATENT DOCUMENTS

| | | | |
|---|---|---|---|
| 6,875,645 B2 * | 4/2005 | Lai | ................................ 438/151 |
| 2001/0035527 A1 | 11/2001 | Tanaka | |
| 2008/0002125 A1 | 1/2008 | Kim | |
| 2010/0304528 A1 | 12/2010 | Kim | |

* cited by examiner

*Primary Examiner* — Hoai V Pham
(74) *Attorney, Agent, or Firm* — Winston Hsu; Scott Margo

(57) ABSTRACT

A manufacturing method of an array substrate includes the following steps. A first conductive layer, a gate insulating layer, a semiconductor layer, an etching stop layer, and a first patterned photoresist are successively formed on a substrate. The etching stop layer and the semiconductor layer uncovered by the first patterned photoresist are then removed by a first etching process. A patterned gate insulating layer and a patterned etching stop layer are then formed through a second etching process. The first conductive layer uncovered by the patterned gate insulating layer is then removed to form a gate electrode. The semiconductor layer uncovered by the patterned etching stop layer is then removed to form a patterned semiconductor layer and partially expose the patterned gate insulating layer.

15 Claims, 34 Drawing Sheets

MANUFACTURING METHOD OF ARRAY SUBSTRATE

CROSS REFERENCE TO RELATED APPLICATIONS

This application is a division of application Ser. No. 13/668,332 filed on Nov. 5, 2012, now allowed, which is incorporated by reference herein in its entirety.

BACKGROUND OF THE INVENTION

1. Field of the Invention

The present disclosure relates to a manufacturing method of an array substrate, and more particularly to a process-simplified manufacturing method of an array substrate.

2. Description of the Prior Art

In the present technique of full color display, active matrix display apparatuses, such as active matrix liquid crystal display (AMLCD) and active matrix organic light emitting diodes (AMOLED), need an array substrate comprising a plurality of thin film transistors (TFTs) arranged in a matrix to drive the display media (such as liquid crystal molecules or organic light emitting layer), and to display the wanted images through arrangements of pixels and mixing of their colors.

The structures of an array substrate and a TFT will vary according to the different semiconductor materials used. In the present display industry, the generally used semiconductor materials include amorphous silicon semiconductor material, polysilicon semiconductor material, organic semiconductor material and oxide semiconductor material. The structure design of an array substrate and the complexity of the manufacturing process are chosen according to the intrinsic property of the semiconductor material and the compatibility of the materials in the TFT and the array substrate. In order to improve the quality of the array substrate and the TFT, a complicated structure is necessary, for example to protect a semiconductor layer with an etching stop layer. However, it also brings in more complexity in the manufacturing process and increases the cost. Therefore, how to improve the quality and simplify the steps of the manufacturing process to increase the competitiveness by adjusting the structure or the manufacturing process is a main objective in the field.

SUMMARY OF THE INVENTION

It is one of the objectives of the disclosure to provide a manufacturing method of an array substrate. By integrating the manufacturing processes of a gate electrode and a patterned semiconductor, a simplified manufacturing process with a reduced number of used photomask can be achieved.

To achieve the purposes described above, a preferred embodiment provides a manufacturing method of an array substrate. The method comprises the following steps. First, a substrate is provided, and then, a first photolithography process is carried out to form a patterned gate insulating layer, a patterned etching stop layer, agate electrode and a patterned semiconductor layer. The first photolithography process comprises the following steps. A first conductive layer, a gate insulating layer, a semiconductor layer and an etching stop layer are successively formed on a substrate. A first patterned photoresist is formed on the etching stop layer. Then, a first etching process is carried out to remove the etching stop layer and the semiconductor layer uncovered by the first patterned photoresist, and to partially expose the gate insulating layer. A second etching process is then carried out to form a patterned gate insulating layer and a patterned etching stop layer by etching the first patterned photoresist, the etching stop layer and the gate insulating layer, and to partially expose the first conductive layer and the semiconductor layer. Then, the first conductive layer uncovered by the patterned gate insulating layer is removed to form a gate electrode. The semiconductor layer uncovered by the patterned etching stop layer is removed to form a patterned semiconductor layer, and to partially expose the patterned gate insulating layer. A second photolithography process is then carried out, and the second photolithography process comprises the following steps. A protective layer is first formed, and the protective layer at least partially covers the substrate and the patterned etching stop layer. Then, the patterned etching stop layer uncovered by the protective layer is removed to at least partially expose the patterned semiconductor layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
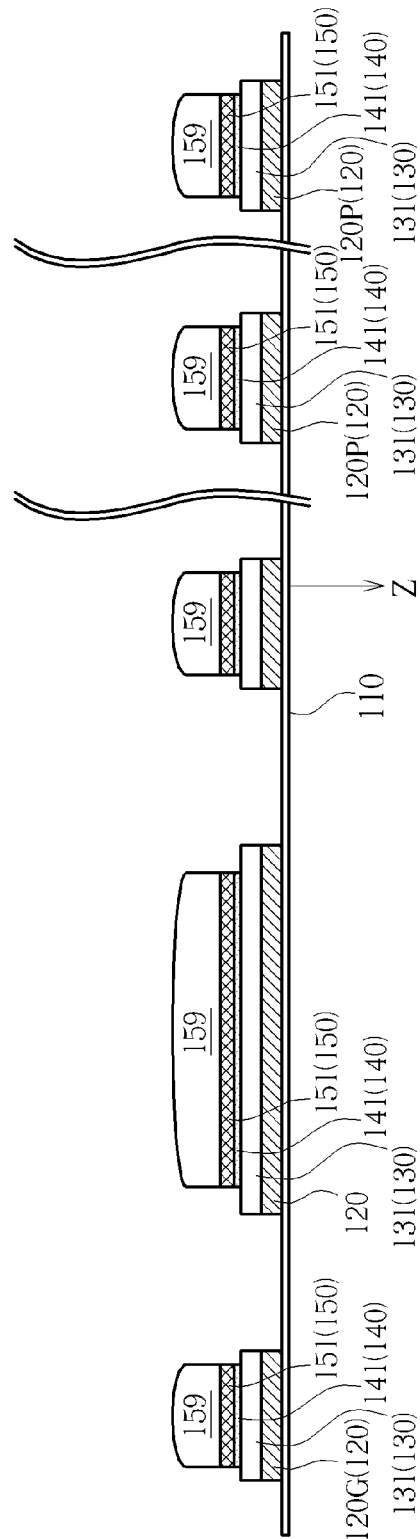
FIGS. 1-8 are schematic diagrams illustrating a manufacturing method of an array substrate according to a first preferred embodiment.
Figure 5:
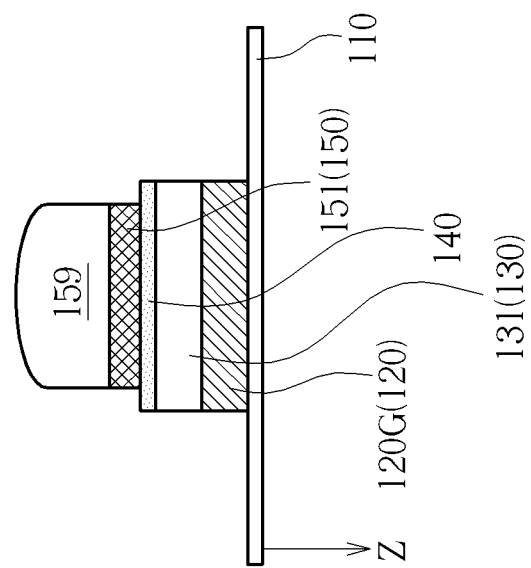
Figure 6:
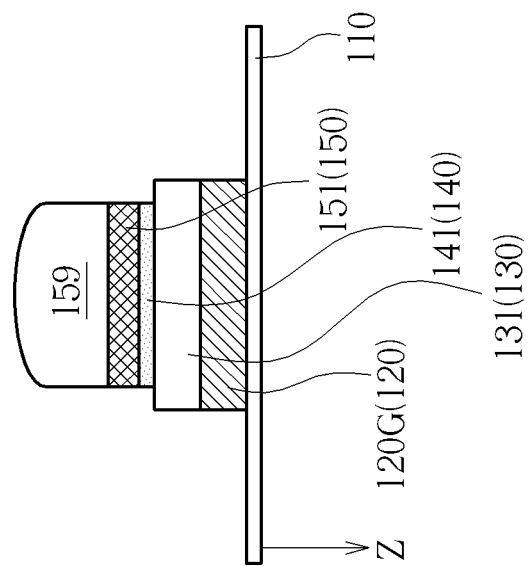
Figure 7:
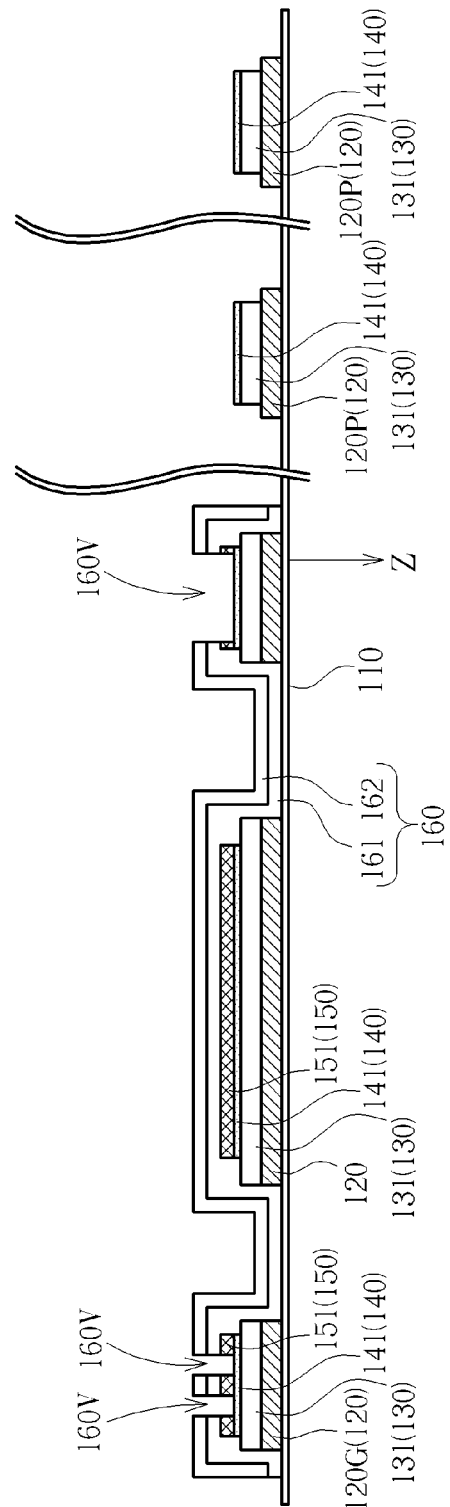
Figure 8:
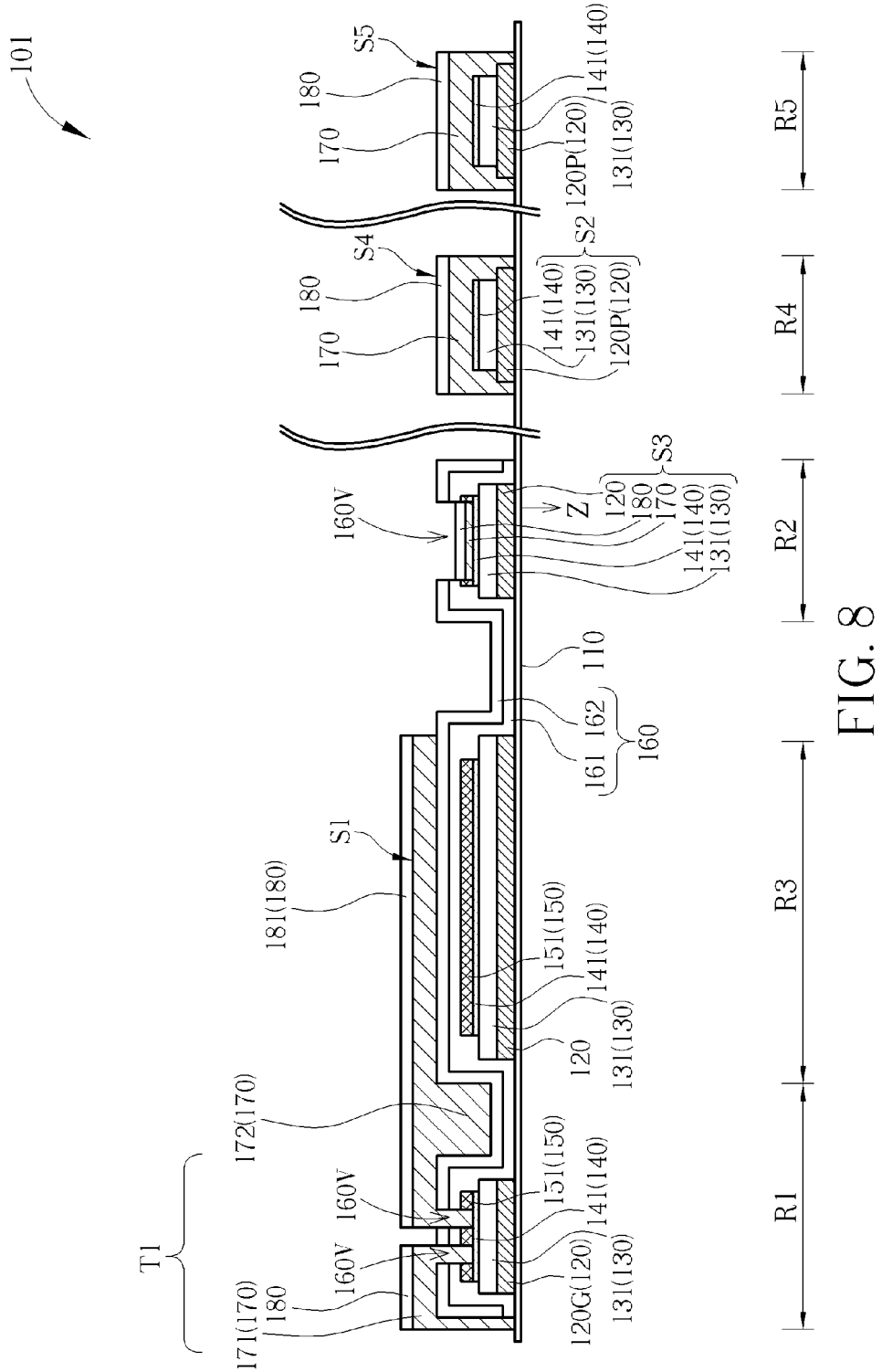

Please refer to FIGS. 1-8. FIGS. 1-8 are schematic diagrams illustrating a manufacturing method of an array substrate according to a first preferred embodiment. FIG. 1 is a schematic diagram illustrating a first photolithography process according to this embodiment. FIG. 7 is a schematic diagram illustrating a second photolithography process according to this embodiment. FIG. 8 is a schematic diagram illustrating a third photolithography process according to this embodiment. FIGS. 2-6 are schematic diagrams illustrating the detailed steps of the first photolithography process according to this embodiment. Please note that the figures are only for illustration and the figures may not be to scale. The scale may be further modified according to different design considerations. The manufacturing method of an array substrate according to this embodiment comprises the following steps. As shown in FIG. 1, a substrate 110 is provided first. Then, a first photolithography process is carried out to form a patterned gate insulating layer 131, a patterned etching stop layer 151, a gate electrode 120G, a pad electrode 120P and a patterned semiconductor layer 141. It is worth noting that each photolithography process in the present disclosure preferably includes thin film processes, photo processes, and etching processes. There is preferably only one photomask or one set of photomask required in each of the photolithography processes in this disclosure, but not limited thereto. Moreover, since the gate electrode 120G, the patterned gate insulating layer 131, the patterned semiconductor layer 141 and the patterned etching stop layer 151 are formed during the same photolithography process, the gate electrode (may also be regarded as a first layer or a bottom layer) 120G, the patterned gate insulating layer (may also be regarded as a second layer) 131, the patterned semiconductor layer (may also be regarded as a third layer) 141 and the patterned etching stop layer (may also be regarded as a fourth layer or a top layer) 151 are substantially stacked in that order along a direction opposite to a direction Z perpendicular to the substrate 110, and an area of the patterned gate insulating layer 131 is substantially equal to or larger than an area of the patterned semiconductor layer 141 and an area of the patterned etching stop layer 151, but not limited thereto.

Figure 2:
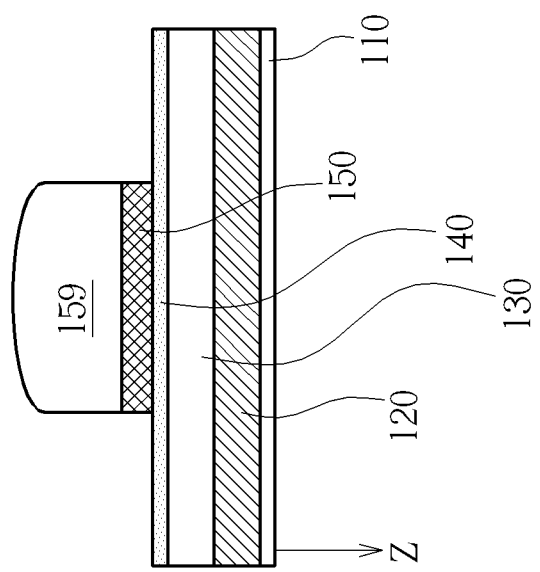
Figure 3:
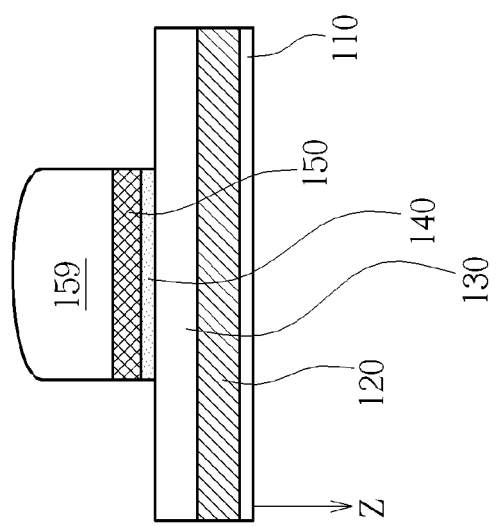

To further explain, the first photolithography process in this embodiment comprises the following steps. As shown in FIG. 2 and FIG. 3, a first conductive layer 120, a gate insulating layer 130, a semiconductor layer 140 and an etching stop layer 150 are successively formed on the substrate 110, and a first patterned photoresist 159 is formed on the etching stop layer 150. In this embodiment, the first conductive layer 120 preferably comprises at least one of the following metallic materials such as aluminum (Al), copper (Cu), silver (Ag), chromium (Cr), titanium (Ti), and molybdenum (Mo), a stack layer of the above-mentioned materials, or an alloy of the above-mentioned materials, but not limited thereto. The gate insulating layer 130 and the etching stop layer 150 preferably respectively comprises an oxide such as silicon oxide, a nitride such as silicon nitride, or an oxynitride such as silicon oxynitride. And the semiconductor layer 140 preferably comprises an oxide semiconductor material such as indium-zinc-tin oxide (IZTO), indium-aluminum-zinc oxide (IAZO), indium-gallium-tin oxide (IGTO), aluminum-zinc oxide (AZO), antimony-tin oxide (ATO), gallium-zinc oxide (GZO), indium-gallium-zinc oxide (IGZO), amorphous silicon semiconductor material, microcrystalline silicon semiconductor material, monocrystalline silicon semiconductor material, nanocrystalline silicon semiconductor material, polysilicon semiconductor material, or organic semiconductor material, but the present disclosure is not limited to the above-mentioned materials. Then, a first etching process is carried out to remove the etching stop layer 150 and the semiconductor layer 140 uncovered by the first patterned photoresist 159, and to partially expose the gate insulating layer 130. In this embodiment, a single etching method to etch the etching stop layer 150 and the semiconductor layer 140 simultaneously, or two different etching methods to etch the etching stop layer 150 and to etch the semiconductor layer 140 successively can be adopted in the first etching process, according to the compatibility of the etching characteristics between the etching stop layer 150 and the semiconductor layer 140.

Figure 4:
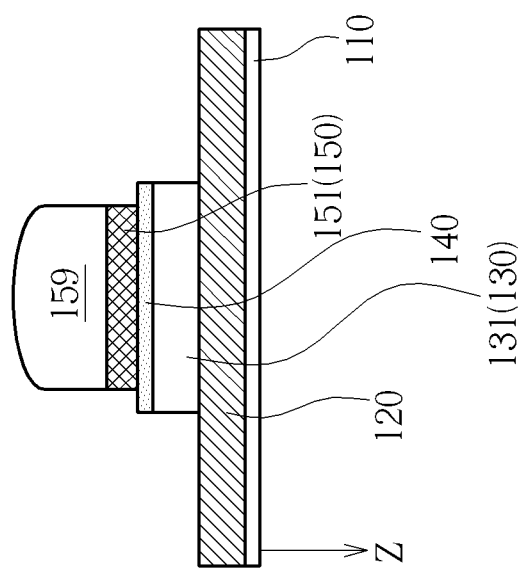

As shown in FIG. 4, a second etching process is then carried out to form a patterned gate insulating layer 131 and a patterned etching stop layer 151 by etching the first patterned photoresist 159, the etching stop layer 150 and the gate insulating layer 130, and to partially expose the first conductive layer 120 and the semiconductor layer 140. The second etching process in this embodiment is preferably an etching process with high etching selectivity between the gate insulating layer 130 and the semiconductor layer 140 so as to avoid the semiconductor layer 140 being etched in the second etching process. In other words, in the second etching process, the etching selectivity is defined as the etching rate of the gate insulating layer 130 divided by the etching rate of the semiconductor layer 140. The high etching selectivity means that the etching rate of the gate insulating layer 130 is far faster than the etching rate of the semiconductor layer 140. In addition, a single etching method, such as dry etching, is preferably adopted to etch the first patterned photoresist 159, the etching stop layer 150 and the gate insulating layer 130 simultaneously in the second preferred etching process, and to partially expose the first conductive layer 120 and the semiconductor layer 140, but the present disclosure is not limited thereto. Different etching methods can be adopted to etch the first patterned photoresist 159, the etching stop layer 150 and the gate insulating layer 130 respectively if necessary. Then, as shown in FIG. 5, the first conductive layer 120 uncovered by the patterned gate insulating layer 131 is removed to form the gate electrode 120G and the pad electrode (not shown in FIG. 5). Then, as shown in FIG. 6, the semiconductor layer 140 uncovered by the patterned etching stop layer 151 is removed to form the patterned semiconductor layer 141, and to partially expose the patterned gate insulating layer 131. Two different etching methods to etch the first conductive layer 120 and to etch the semiconductor layer 140 respectively or a single etching method to etch the first conductive layer 120 and the semiconductor layer 140 simultaneously can be adopted in this embodiment, according to the compatibility of the etching characteristics between the first conductive layer 120 and the semiconductor layer 140. It is worth noting that since the gate electrode 120G, the patterned semiconductor layer 141 and the patterned etching stop layer 151 are formed by only using the first patterned photoresist 159, a simplified manufacturing process and with a reduced number of used photomasks can be achieved to save cost.

As shown in FIG. 7, after the first photolithography process, a second photolithography process is then carried out, and the second photolithography process comprises the following steps. First, a protective layer 160 is formed, and the protective layer at least partially covers the substrate 110, the patterned gate insulating layer 131 and the patterned etching stop layer 151. Then, the patterned etching stop layer 151 uncovered by the protective layer 160 is removed to at least partially expose the patterned semiconductor layer 141. The protective layer 160 comprises an inorganic material such as aluminum oxide, silicon nitride, silicon oxide or silicon oxynitride, an organic material such as acrylic resin, a single layer of the above-mentioned materials, or a stacked layer of the above-mentioned materials, but not limited thereto. For example, the protective layer 160 preferably comprises a first protective layer 161 and a second protective layer 162. The first protective layer 161 preferably comprises a material compatible with the semiconductor layer 140, such as silicon nitride, silicon oxide or silicon oxynitride, and the second protective layer 162 preferably comprises a material which has good protective properties, such as aluminum oxide, but not limited thereto. In addition, the second photolithography process in this embodiment further comprises removing the patterned gate insulating layer 131 uncovered by the patterned semiconductor layer 141 to at least partially expose the pad electrode 120P in order to be electrically connected to other conductive layer formed subsequently. Moreover, the second photolithography process in this embodiment further comprises forming a plurality of contact openings 160V in the protective layer 160 and the patterned etching stop layer 151 through etching to respectively partially expose the patterned semiconductor layer 141 in different regions.

As shown in FIG. 8, after the second photolithography process, a third photolithography process is then carried out to form a source electrode 171 and a drain electrode 172 on the protective layer 160 and the patterned semiconductor layer 141. The source electrode 171 and the drain electrode 172 are electrically connected to the patterned semiconductor layer 141 through the different contact openings 160V respectively. Additionally, the third photolithography process in this embodiment comprises the following steps. First, a second conductive layer 170 is formed to cover the protective layer 160 and the patterned semiconductor layer 141. The second conductive layer 170 preferably comprises at least one metallic material, such as aluminum (Al), copper (Cu), silver (Ag), chromium (Cr), titanium (Ti), and molybdenum (Mo), a stack layer of the above-mentioned materials, or an alloy of the above-mentioned materials, but not limited thereto. It is worth noting that the second conductive layer 170 can be electrically connected to the region of the pad electrode 120P uncovered by the patterned gate insulating layer 131. Then, a photoresist (not shown) can be formed on the second conductive layer 170, and the source electrode 171 and the drain electrode 172 are formed through etching the second conductive layer 170 uncovered by the photoresist. A thin film transistor T1 may then be formed on the substrate 110, and an array substrate 101 comprising the thin film transistor T1 may be formed accordingly. Furthermore, it also can be selected to form a third conductive layer 180 on the second conductive layer 170 before the above-mentioned photoresist is formed in the third photolithography process. The source electrode 171 and the drain electrode 172 are formed by etching the second conductive layer 170 and the third conductive layer 180, and a pixel electrode 181 is formed on the drain electrode 172, but in the present disclosure is not limited to this. The extended portion of the drain electrode 172 itself can act as a pixel electrode or the drain electrode 172 can be a bridge connected to a pixel electrode formed by other metal layers. The third conductive layer 180 in this embodiment can comprise a transparent conductive material such as indium-tin oxide (ITO), indium-zinc oxide (IZO), aluminum-zinc oxide (AZO), or thin film metal, or comprise an other opaque conductive material such as aluminum (Al), copper (Cu), silver (Ag), chromium (Cr), titanium (Ti), and molybdenum (Mo), a stack layer of the above-mentioned materials, or an alloy of the above-mentioned materials, but not limited thereto.

Please refer to FIG. 8 again. As shown in FIG. 8, an array substrate 101 is provided in this embodiment. The array substrate 101 comprises a substrate 110 and a thin film transistor T1. The thin film transistor T1 is disposed on the substrate 110, and comprises a gate electrode 120G, a patterned gate insulating layer 131, a patterned semiconductor layer 141, a patterned etching stop layer 151, a protective layer 160, a source electrode 171 and a drain electrode 172. In addition, the array substrate 101 further comprises a pad electrode 120P. The gate electrode 120G and the pad electrode 120P are disposed on the substrate 110, and the pad electrode 120 preferably is uncovered by the protective layer 160, but not limited thereto. The patterned gate insulating layer 131 is disposed on the gate electrode 120G. The patterned semiconductor layer 141 is disposed on the patterned gate insulating layer 131. The patterned etching stop layer 151 is disposed on the patterned semiconductor layer 141. The protective layer 160 is disposed on the patterned etching stop layer 151, and the protective layer 160 and the patterned etching stop layer 151 comprise a plurality of contact openings 160V to partially expose the patterned semiconductor layer 141. The protective layer 160 preferably comprises a stack structure of a first protective layer 161 and a second protective layer 162, but not limited thereto. The source electrode 171 and the drain electrode 172 are disposed on the protective layer 160 and the patterned semiconductor layer 141, and the source electrode 171 and the drain electrode 172 are electrically connected to the patterned semiconductor layer 141 by the contact openings 160V. It is worth noting that the gate electrode 120G, the patterned gate insulating layer 131, the patterned semiconductor layer 141, the patterned etching stop layer 151, the protective layer 160, the source electrode 171 and the drain electrode 172 are combined together to become a thin film transistor T1 on the substrate 110. The array substrate 101 in this embodiment further comprises a pixel electrode 181 disposed on the drain electrode 172, but it is not limited thereto. The extended portion of the drain electrode 172 itself can act as a pixel electrode or the drain electrode 172 can be a bridge connecting to a pixel electrode formed by other metal layers. In this embodiment, the pixel electrode 181 at least partially overlaps the patterned semiconductor layer 141 along the direction Z perpendicular to the substrate 110, but not limited thereto. The patterned semiconductor layer 141 in this embodiment preferably comprises oxide semiconductor material, monocrystalline silicon semiconductor material, microcrystalline silicon semiconductor material, nanocrystalline silicon semiconductor material, amorphous silicon semiconductor material, polysilicon semiconductor material or organic semiconductor material. Moreover, the array substrate 101 in this embodiment can be applied in a liquid crystal display, an organic electroluminescent display, an electro wetting display or an electronic paper display, but not limited thereto.

Furthermore, the regions illustrated in FIG. 8 respectively include a region R1, a region R2, a region R3, a region R4 and a region R5. The region R1 located at the left side can be regarded as a thin film transistor region, and comprises the thin film transistor T1. The region R2 can be regarded as a capacitance region, and comprises a capacitance structure S3 composed of the first conductive layer 120, the gate insulating layer 130, the semiconductor layer 140, the second conductive layer 170 and the third conductive layer 180 (ex. a portion of the pixel electrode). The region R3 between the region R1 and region R2 can be regarded as a pixel region, and comprises the pixel electrode 181 electrically connected to the thin film transistor T1. More particularly, there is a first stacked structure S1 below the pixel electrode 181 in this embodiment, and the layer sequence from bottom to top in the first stacked structure S1 is the first conductive layer 120, the gate insulating layer 130, the semiconductor layer 140, the etching stop layer 150, the protective layer 160, and the second conductive layer 170. The region R4 can be regarded as a contact region or a connecting region of the first conductive layer 120 and the second conductive layer 170. The region R4 comprises a connecting structure S4. The connecting structure S4 includes a second stacked structure S2 (including the first conductive layer 120, the gate insulating layer 130 and the semiconductor layer 140), the second conductive layer 170 covering the second stacked structure S2 and partially in contact with the first conductive layer 120, and a portion of the third conductive layer 180 (ex. a portion of the pixel electrode) disposed on the second conductive layer 170. The region R5 located at the right side can be regarded as a pad region, and comprises a pad electrode structure S5. The structure of the pad electrode S5 is similar to the connecting structure S4. The denomination and the definitions of each region mentioned in this embodiment can be applied to every embodiment in the present disclosure. The structure of each embodiment will be somewhat different from others, and it will be explained according to the structure of each embodiment.

The following description is based on different embodiments of the array substrate in the present disclosure. To simplify the description, the following description will focus on the differences among embodiments rather than the similar parts. Furthermore, the same reference numbers are used to describe similar elements in the description of different embodiments for convenience and clarity.

Figure 9:
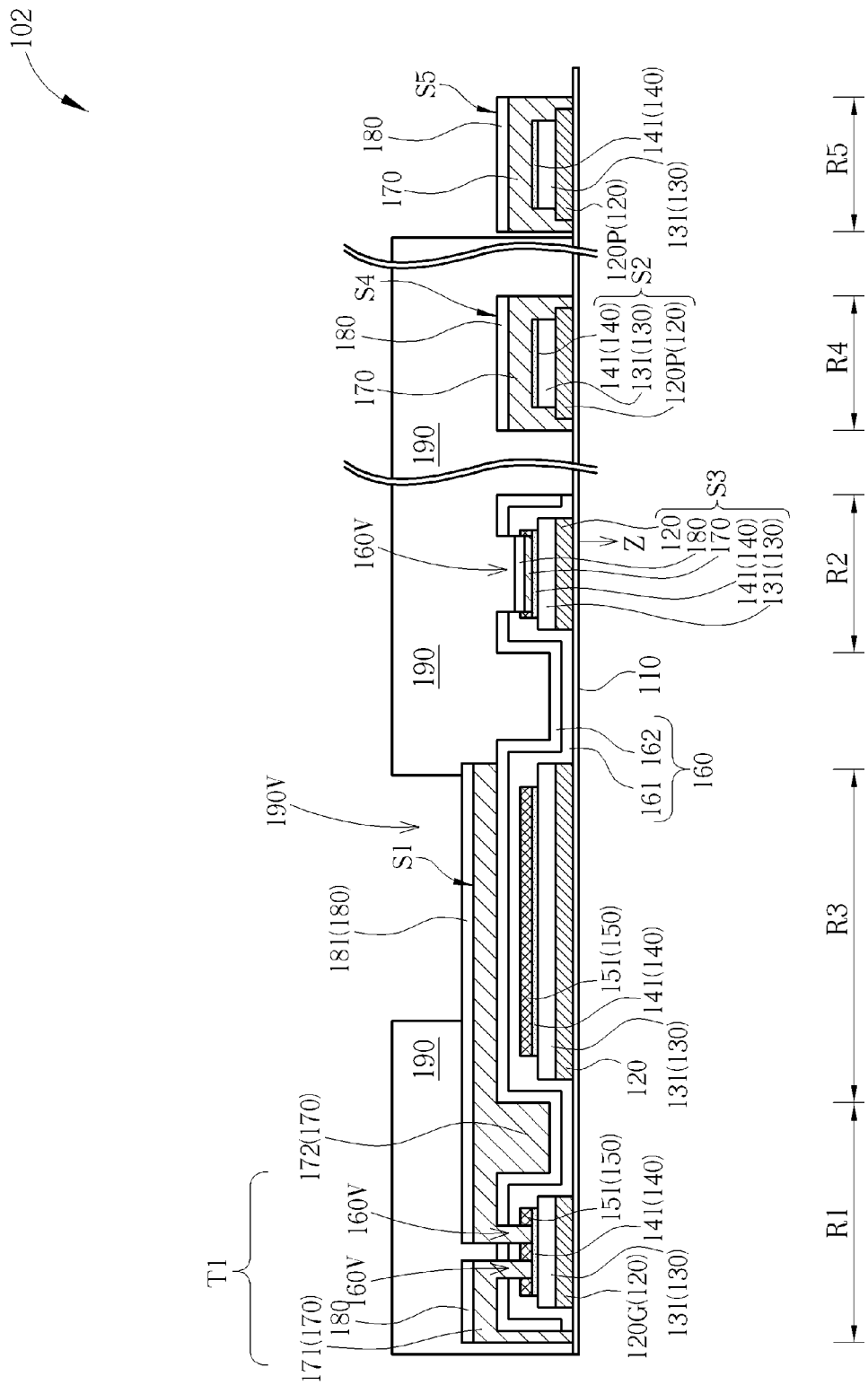
FIG. 9 is a schematic diagram illustrating a manufacturing method of an array substrate according to a second preferred embodiment.

Please refer to FIG. 9, and also refer to FIGS. 1-8. FIG. 9 is a schematic diagram illustrating a manufacturing method of an array substrate according to a second preferred embodiment. As shown in FIG. 9, to compare with the manufacturing method of an array substrate according to the first preferred embodiment, the manufacturing method in this embodiment further comprises performing a fourth photolithography process to form an isolation layer 190 on the pixel electrode 181 after the third photolithography process. The isolation layer 190 at least partially covers the substrate 110, the source electrode 171, the drain electrode 172 and the protective layer 160. An array substrate 102 is formed accordingly. The isolation layer 190 comprises a pixel opening 190V, and the pixel opening 190V at least partially exposes the pixel electrode 181. The pixel opening 190V can be called an effective pixel region, which is substantially equal to the above-mentioned pixel region. It is worth noting that the isolation layer 190 can be selected to only partially cover the pad electrode 120P, the second conductive layer 170 and the third conductive layer 180 corresponding to the pad electrode 120P, and to partially expose the second conductive layer 170 and the third conductive layer 180 corresponding to the pad electrode 120P. Then an outside circuit or an outside device (not shown) can be electrically connected to the array substrate 102 via a portion of the pad electrode 120P uncovered by the isolation layer 190. This embodiment is similar to the first preferred embodiment apart from the array substrate 102 which further comprises the isolation layer 190 disposed on the substrate 110 to cover at least a portion of the substrate 110, the source electrode 171, the drain electrode 172 and the protective layer 160. The isolation layer 190 in this embodiment can be a single layer or a multi-layer stacked structure, and it may comprise an organic material such as acrylic resin, or an inorganic material such as silicon nitride, silicon oxide, silicon oxynitride, indium-zinc-tin oxide (IZTO), indium-aluminum-zinc oxide (IAZO), indium-gallium-tin oxide (IGTO), aluminum-zinc oxide (AZO), antimony-tin oxide (ATO), gallium-zinc oxide (GZO), indium-gallium-zinc oxide (IGZO), or other materials suitable for an isolation layer. When the array substrate 102 is applied to an organic electroluminescent display, an organic light-emitting material can be disposed in the pixel opening 190V. In order to prevent the materials from polluting each other, different materials which emit different color lights are isolated in each pixel opening by the disposition of the isolation layer 190. The preferred isolation layer 190 can be a multi-layer structure. For example, a two-layer stacked structure in which the upper layer of the stacked structure is an organic material, and the lower layer of the stacked structure is an inorganic material. To increase the affinity of the organic light-emitting material with the inorganic material, the organic material is hydrophobic and insulating, while the inorganic material is hydrophilic and insulating. The inorganic material preferably comprises indium-zinc-tin oxide (IZTO), indium-aluminum-zinc oxide (IAZO), indium-gallium-tin oxide (IGTO), aluminum-zinc oxide (AZO), antimony-tin oxide (ATO), gallium-zinc oxide (GZO), or indium-gallium-zinc oxide (IGZO). In addition, if the source electrode 171 or the pixel electrode 181 is an opaque conductive material, the organic electroluminescent display with the array substrate 102 can be a top emission organic electroluminescent display, but not limited thereto. Furthermore, the denomination of each region in the second preferred embodiment is according to the first preferred embodiment, and the differences between the second preferred embodiment and the first preferred embodiment areas follows: in the second preferred embodiment, the region R1, the region R2 and the region R4 are all covered by the isolation layer 190, a portion of the region R3 is also covered by the isolation layer 190, but the region R5 is not covered by the isolation layer 190.

Figure 10:
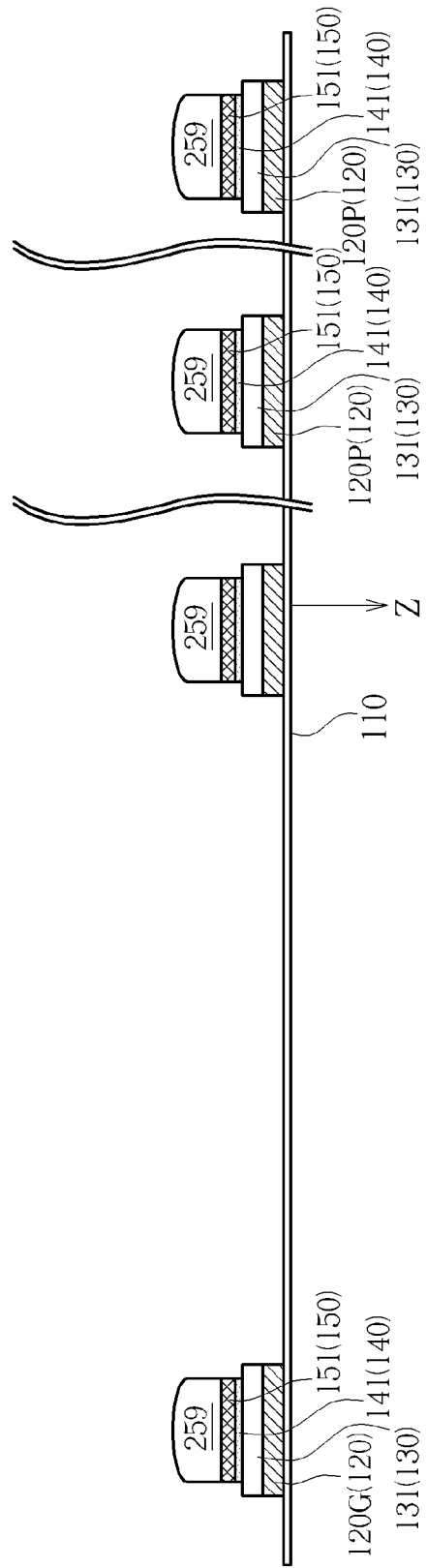
FIGS. 10-12 are schematic diagrams illustrating a manufacturing method of an array substrate according to a third preferred embodiment.
Figure 11:
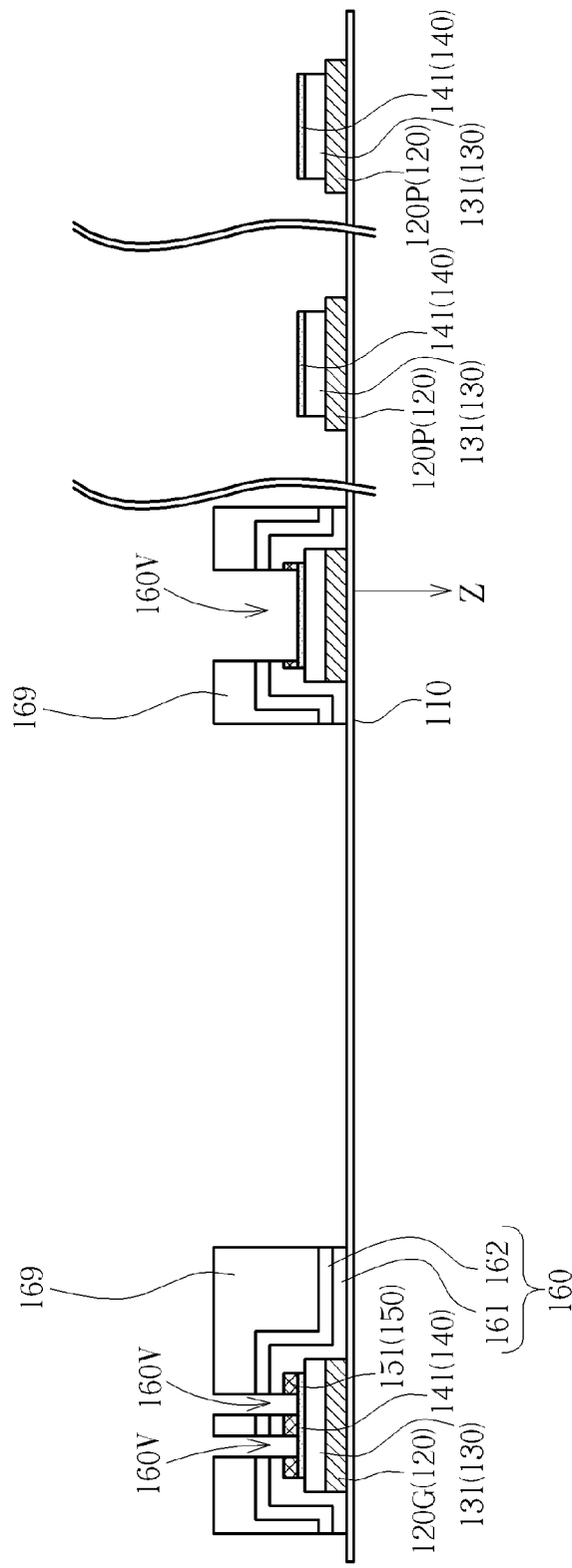
Figure 12:
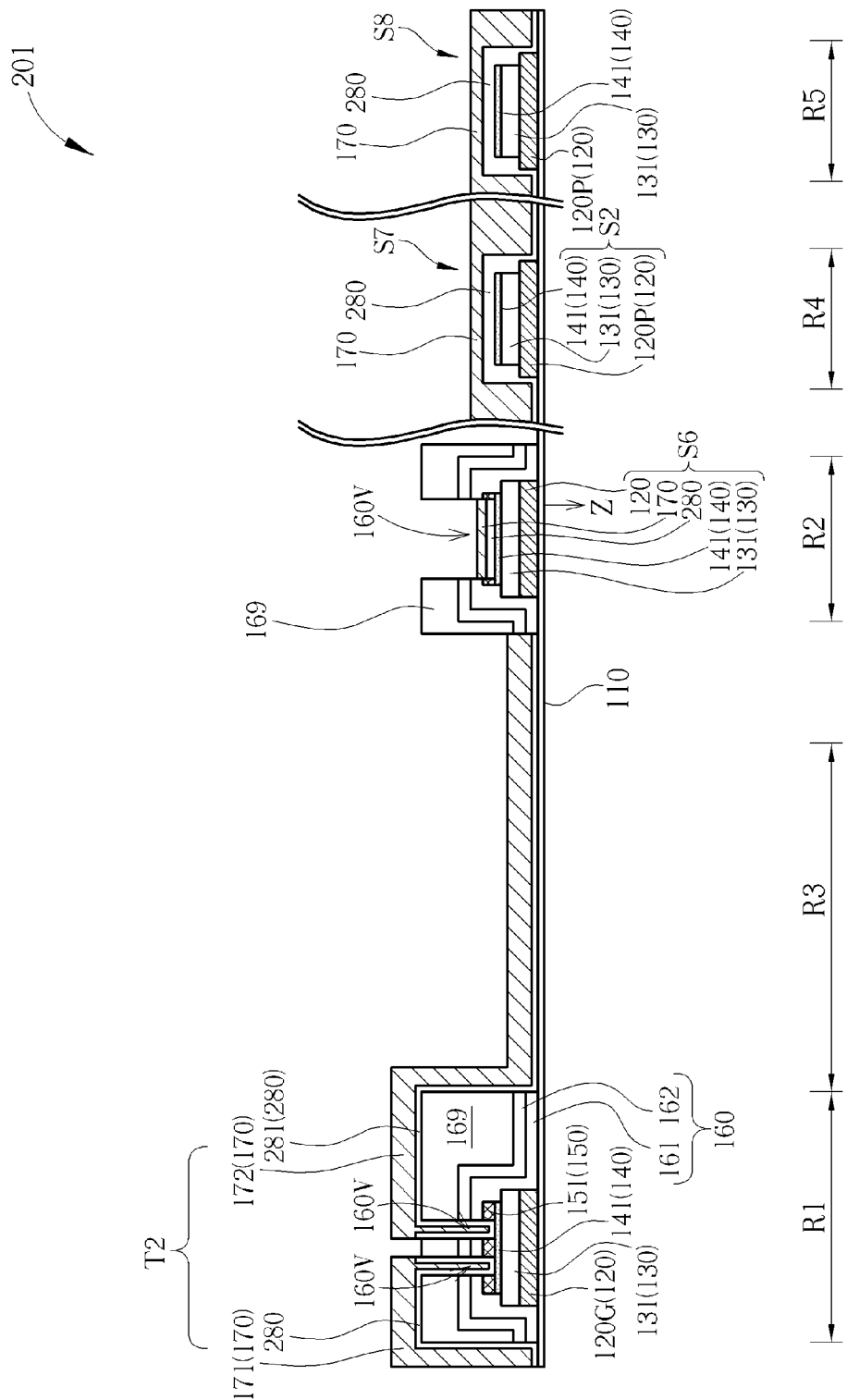

Please refer to FIGS. 10-12. FIGS. 10-12 are schematic diagrams illustrating a manufacturing method of an array substrate according to a third preferred embodiment. FIG. 10 is a schematic diagram illustrating the first photolithography process in this embodiment, FIG. 11 is a schematic diagram illustrating the second photolithography process in this embodiment, and FIG. 12 is schematic diagram illustrating the third photolithography process in this embodiment. The manufacturing method of an array substrate according to this embodiment comprises the following steps. As shown in FIG. 10, a substrate 110 is first provided. A first photolithography process is then carried out to define a patterned gate insulating layer 131, a patterned etching stop layer 151, a gate electrode 120G, a pad electrode 120P and a patterned semiconductor layer 141 by using a first patterned photoresist 259. Each step of the first photolithography process in this embodiment is similar to the first preferred embodiment except for the pattern distribution of the first patterned photoresist 259 in this embodiment which is different from the pattern distribution of the first patterned photoresist 159 in the first preferred embodiment. The detailed steps of the first photolithography process can be referred in FIGS. 2-6.

As shown in FIG. 11, a second photolithography process is carried out. It comprises the following steps. First, a protective layer 160 is formed by using a second patterned photoresist 169. The protective layer at least partially covers the substrate 110, the patterned gate insulating layer 131 and the patterned etching stop layer 151. Then, the patterned etching stop layer 151 uncovered by the protective layer 160 is removed to at least partially expose the patterned semiconductor 141. The second patterned photoresist 169 preferably comprises an organic material such as acrylic resin, or an inorganic material such as silicon nitride, silicon oxide, or silicon oxynitride, but not limited thereto. It is worth noting that each step of the second photolithography process in this embodiment is similar to the first preferred embodiment except for the second patterned photoresist 169 in this embodiment can be left on the substrate 110 compared to the first preferred embodiment. Furthermore, the material of the second patterned photoresist 169 in this embodiment is preferred to be a material that can be used as an isolation layer (not shown in FIG. 11), but not limited thereto.

As shown in FIG. 12, after the second photolithography process, a third photolithography process is then carried out to form a source electrode 171 and a drain electrode 172 on the second patterned photoresist 169 and the patterned semiconductor layer 141, and to further form a thin film transistor T2 on the substrate 110 and an array substrate 201 comprising the thin film transistor T2. In addition, the manufacturing method of the array substrate according to this embodiment further comprises forming a pixel electrode 281 between the drain electrode 172 and the protective layer 160 through the third photolithography process, but not limited thereto. The extended portion of the drain electrode 172 itself can act as a pixel electrode, or the drain electrode 172 can be a bridge connecting to a pixel electrode formed by other metal layers. More precisely, it can be selected to form a third conductive layer 280 before the second conductive layer 170 is formed, and the source electrode 171, the drain electrode 172 and the pixel electrode 281 are formed by etching the second conductive layer 170 and the third conductive layer 180 after the second conductive layer 170 is formed. The disposition of the workpiece and the material characteristic of the array substrate 201 in this embodiment are similar to the array substrate 101 in the first preferred embodiment except for the second patterned photoresist 169, the third conductive layer 208 and the pixel electrode 281 disposed between the drain electrode 172 and the second patterned photoresist 169. It is worth noting that the pixel electrode 281 at least partially overlaps the patterned semiconductor layer 141 along the direction Z perpendicular to the substrate 110 and is electrically connected to the patterned semiconductor layer 141 via the contact opening 160V in this embodiment.

Moreover, the regions illustrated in FIG. 12 include a region R1, a region R2, a region R3, a region R4 and a region R5 respectively. The region R1 can be regarded as a thin film transistor region that comprises the thin film transistor T2. The region R2 can be regarded as a capacitance region that comprises a capacitance structure S6 composed of the first conductive layer 120, the gate insulating layer 130, the semiconductor layer 140, the third conductive layer 280 (ex. a portion of the pixel electrode) and the second conductive layer 170, and more particularly, the stacked structure formed by the protective layer 160 and the second patterned photoresist 169 partially covers the capacitance structure S6. The region R3 between the region R1 and the region R2 can be regarded as a pixel region, and the pixel electrode 281 is electrically connected to the thin film transistor T2. And more particularly, there is no stacked structures or film layers below the pixel electrode 281 in this embodiment, and the bottom surface of the pixel electrode 281 directly contacts the upper surface of the substrate 110. The region R4 can be regarded as a contact region or a connecting region of the first conductive layer 120 and the second conductive layer 170, and comprises a connecting structure S7. The connecting structure S7 comprises a second stacked structure S2 (including the first conductive layer 120, the gate insulating layer 130 and the semiconductor layer 140), a portion of the third conductive layer 280 (ex. a portion of the pixel electrode) covering the second stacked structure S2 and partially contacting the first conductive layer 120, and the second conductive layer 170 disposed on the third conductive layer 280. The region R5 can be regarded as a pad region, and comprises a pad electrode structure S8. The structure of the pad electrode S8 is similar to the connecting structure S7.

Figure 13:
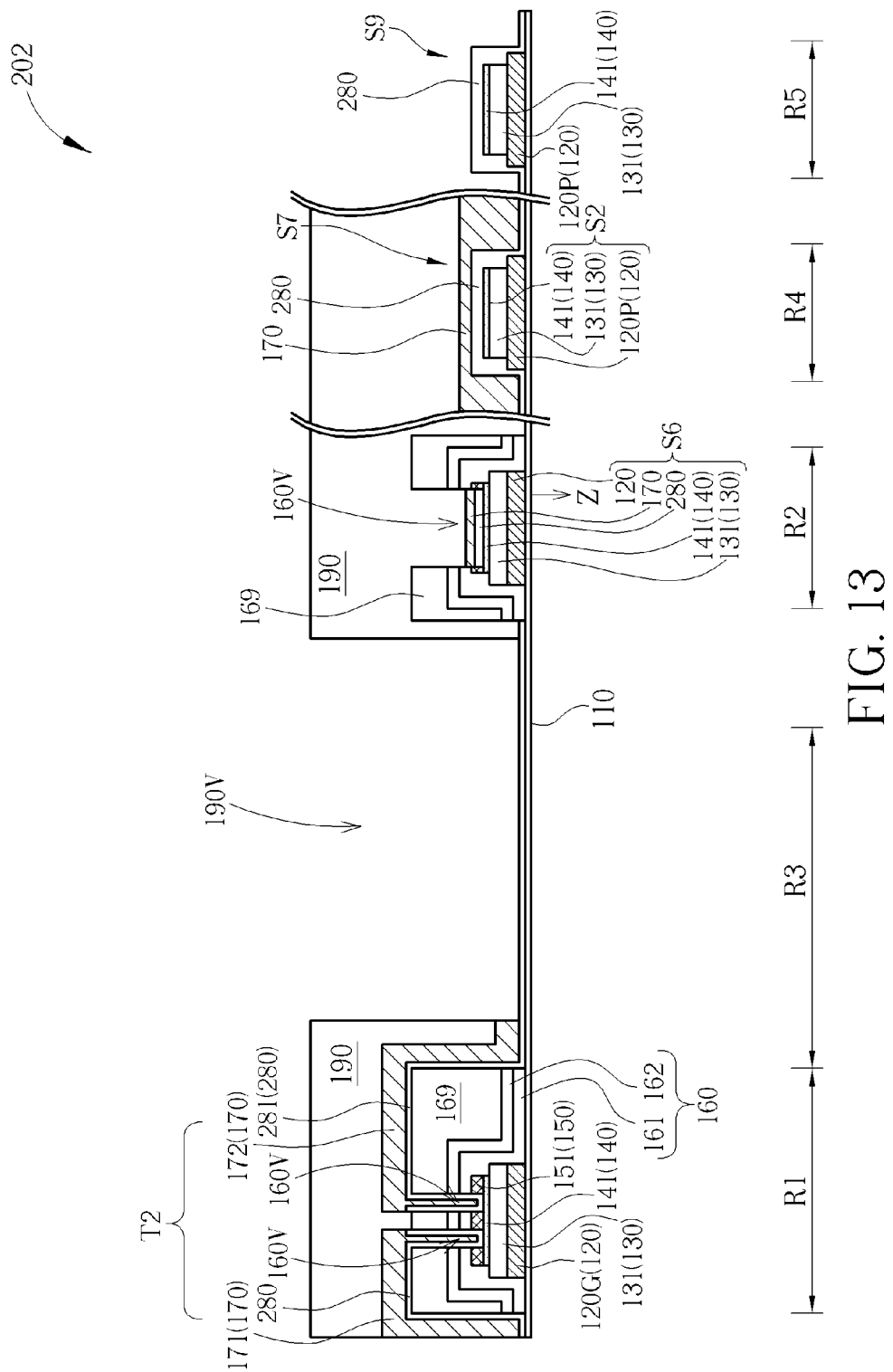
FIG. 13 is a schematic diagram illustrating a manufacturing method of an array substrate according to a fourth preferred embodiment.

Please refer to FIG. 13, and to FIGS. 10-12 as well. FIG. 13 is a schematic diagram illustrating a manufacturing method of an array substrate according to a fourth preferred embodiment. As shown in FIG. 13, unlike the manufacturing method of an array substrate according to the third preferred embodiment, this embodiment further comprises performing a fourth photolithography process to form an isolation layer 190 on the source electrode 171 and the drain electrode 172 after the third photolithography process, so as to at least partially cover the source electrode 171, the drain electrode 172 and the second patterned photoresist 169, thereby forming an array substrate 202. In this embodiment, the fourth photolithography process further comprises removing the second conductive layer 170 uncovered by the isolation layer 190 to partially expose the pixel electrode 281 and the third conductive layer 280. In addition, the isolation layer 190 has a pixel opening 190V, and the pixel opening 190V at least partially exposes the pixel electrode 281. The pixel opening 190V can be called as an effective pixel region which is substantially equal to the above-mentioned pixel region in the third preferred embodiment. The isolation layer 190 can be a single layer or a multi-layer stacked structure, and it comprises one of the materials described in the above-mentioned embodiments. The disposition and the material characteristic of the array substrate 202 in this embodiment are similar to those of the array substrate 201 in the third preferred embodiment, apart from the presence of an isolation layer 190 on the array substrate 202. To simplify the manufacturing process, the second conductive layer 170 can be etched by utilizing the isolation layer 190 to expose the pixel electrode 281, but not limited thereto. The array substrate 202 in this embodiment can also be applied in a liquid crystal display, an organic electroluminescent display, an electro wetting display or an electronic paper display. When the array substrate 202 is used in an organic electroluminescent display, it can become a top emission organic electroluminescent display, a bottom emission organic electroluminescent display or a double-faced emission organic electroluminescent display regarding which material of the pixel electrode 281 and which disposition of the reflective layer (not shown) have been chosen, since there is no other opaque material covering the pixel electrode 281 along the direction Z at the pixel opening 190V in this embodiment. The structure differences between the region R3 and the region R5 in the fourth preferred embodiment and in the region R3 and the region R5 in the third preferred embodiment are as follows. There is no other film layer above or below the pixel electrode 281 in the effective pixel region in the region R3 of the fourth preferred embodiment. In other words, the bottom surface of the pixel electrode 281 directly contacts the upper surface of the substrate 110. But the region R3 in the third preferred embodiment is covered by the second conductive layer 170. And there is no the second conductive layer 170 in the region R5 in the fourth preferred embodiment. In other words, the pad electrode structure S9 only comprises the second stacked structure S2 (including the first conductive layer 120, the gate insulating layer 130 and the semiconductor layer 140) and the third conductive layer 280 (ex. a portion of the pixel electrode) which partially covers the second stacked structure S2 and partially contacts the first conductive layer 120, while the region R5 in the third preferred embodiment is also covered by the second conductive layer 170. Furthermore, as shown in FIG. 13, the region R1, the region R2, the region R4 and a portion of the region R3 are covered by the isolation layer 190, but the region R5 is not covered by the isolation layer 190.

Figure 14:
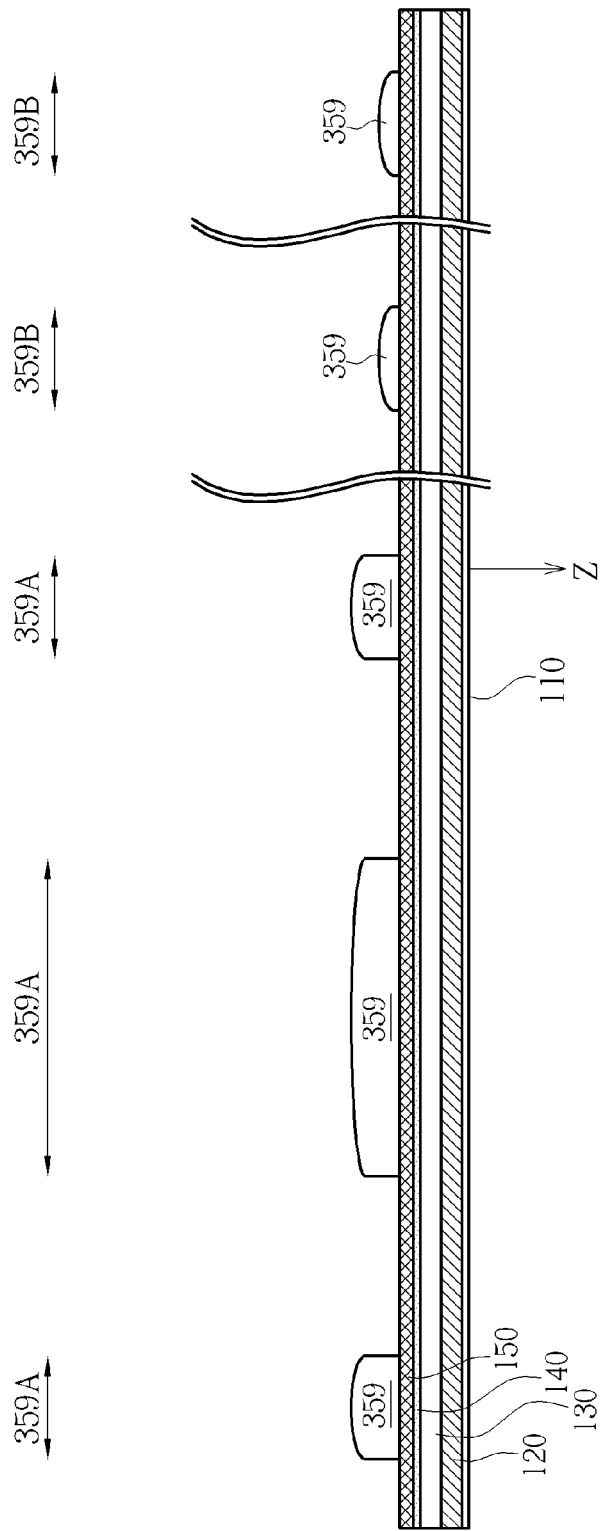
FIGS. 14-22 are schematic diagrams illustrating a manufacturing method of an array substrate according to a fifth preferred embodiment.
Figure 15:
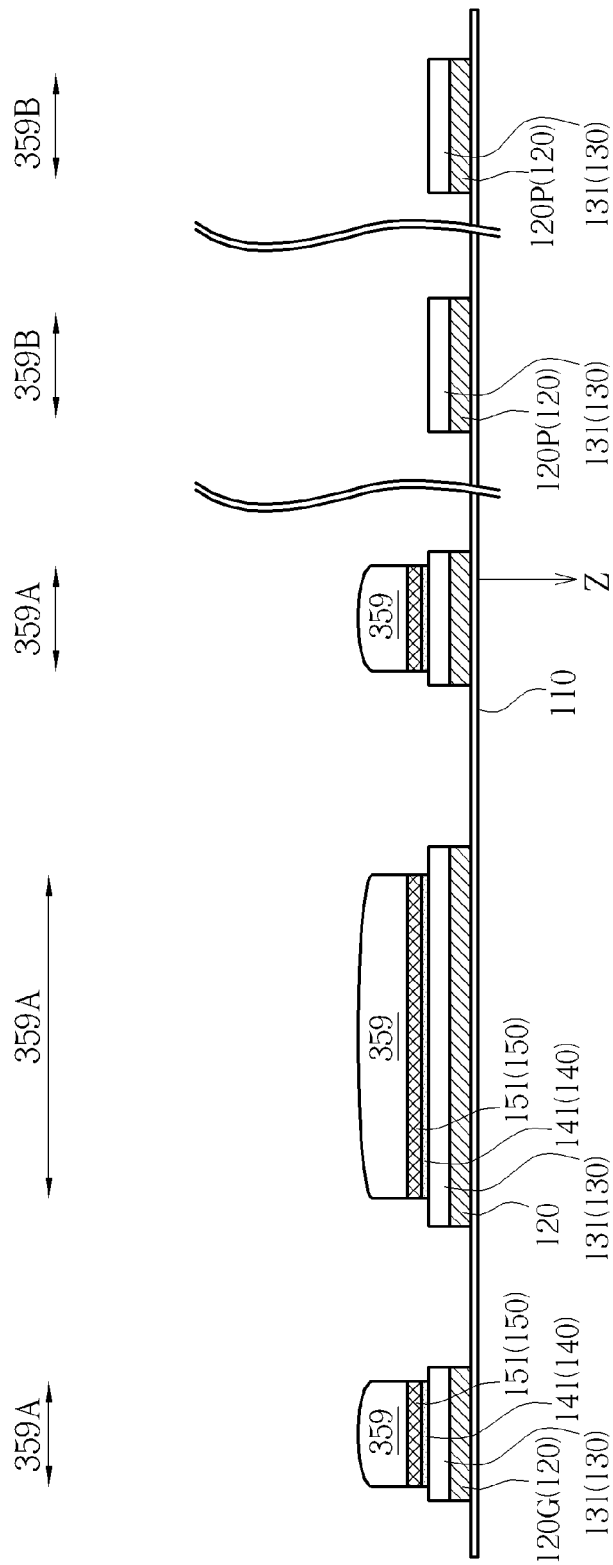
Figure 19:
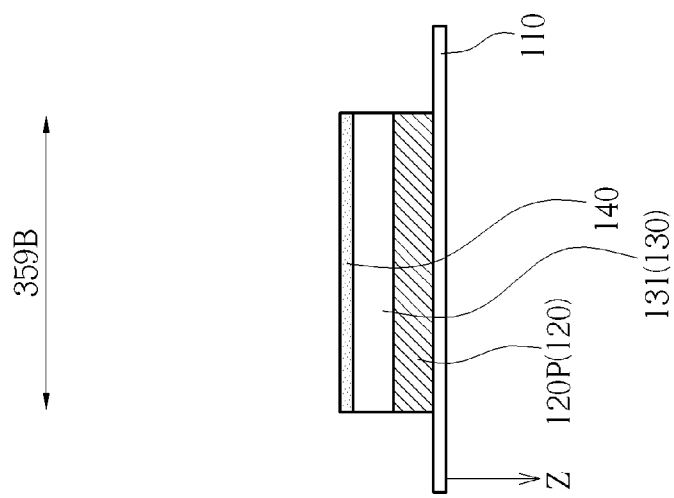
Figure 20:
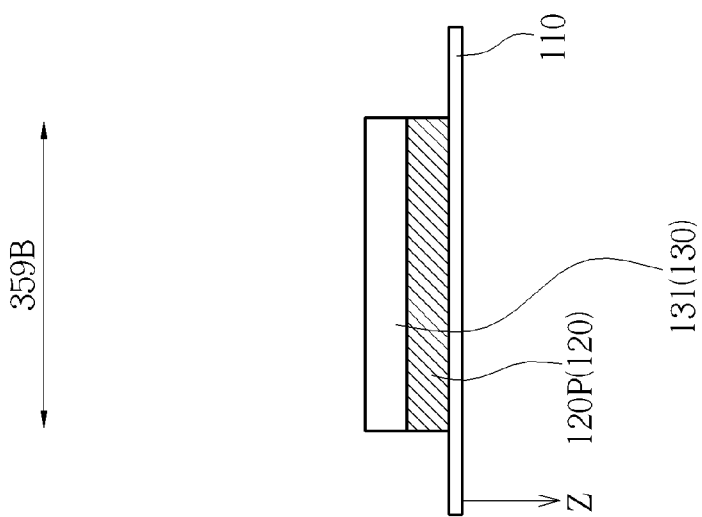
Figure 21:
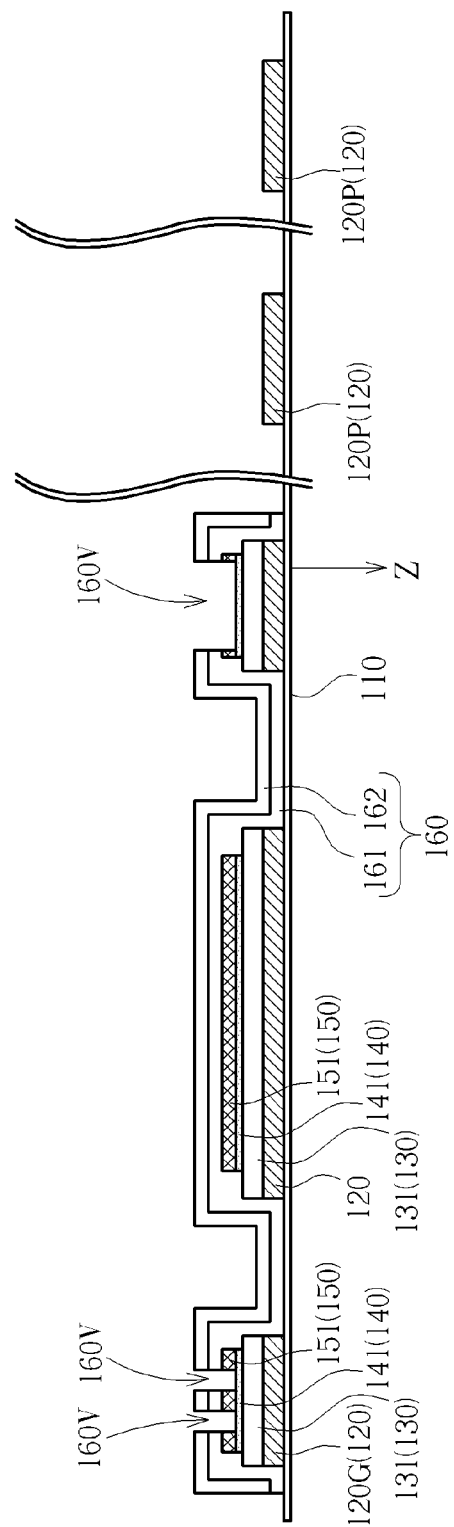
Figure 22:
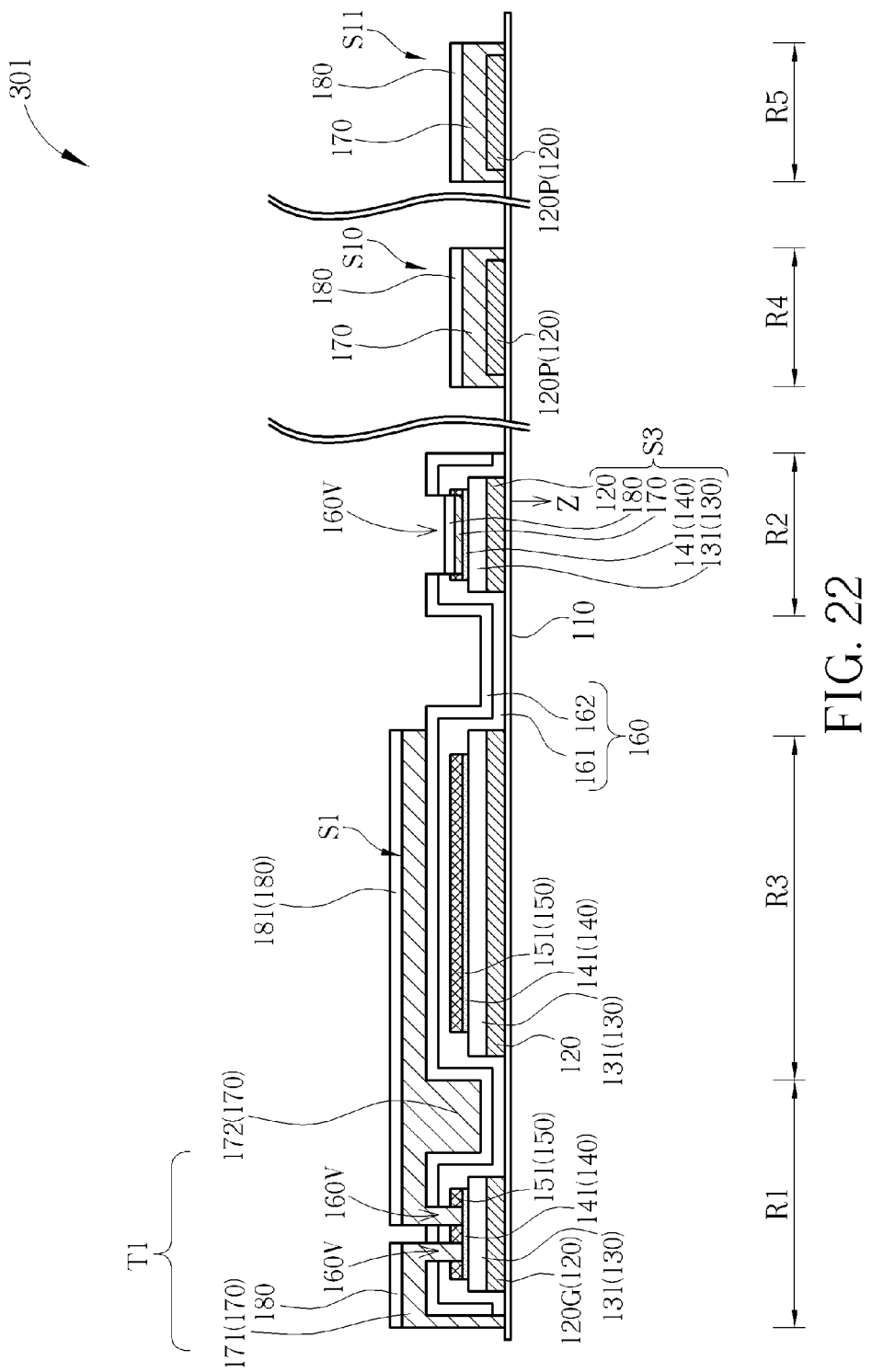

Please refer to FIGS. 14-22. FIGS. 14-22 are schematic diagrams illustrating a manufacturing method of an array substrate according to a fifth preferred embodiment. FIG. 14 and FIG. 15 are schematic diagrams illustrating a first photolithography process in this embodiment. FIG. 21 is a schematic diagram illustrating a second photolithography process in this embodiment. FIG. 22 is a schematic diagram illustrating a third photolithography process in this embodiment. And FIGS. 16-20 are schematic diagrams illustrating detailed steps of the first photolithography process in this embodiment. As shown in FIG. 14, the first photolithography process in this embodiment comprises successively forming a first conductive layer 120, a gate insulating layer 130, a semiconductor layer 140 and an etching stop layer 150 on the substrate 110, and forming a first patterned photoresist 359 on the etching stop layer 150. What is different from the first preferred embodiment is that the first patterned photoresist 359 in this embodiment has a first thickness region 359A and a second thickness region 359B, and a thickness of the first patterned photoresist 359 in the second thickness region 359B is thinner than a thickness of the first patterned photoresist 359 in the first thickness region 359A. It is worth noting that the thickness difference of the first thickness region 359A and the second thickness region 359B may be obtained through using a multi-tone photomask (not shown), and the multi-tone photomask has at least three regions of different transmitting ratios, but the present disclosure is not limited to this. In another preferred embodiments of the present disclosure, other appropriate approaches may also be used to obtain the thickness difference between the first thickness region 359A and the second thickness region 359B. Then, as shown in FIG. 15, a patterned gate insulating layer 131, a patterned etching stop layer 151, a gate electrode 120G, a pad electrode 120P and a patterned semiconductor layer 141 are respectively formed in the first photolithography process by using the first patterned photoresist 359 as a mask in the following etching process to remove the above-mentioned stacked films. It is worth noting that the first photolithography process in this disclosure further comprises removing the patterned semiconductor 141 and the patterned etching stop layer 151 above the pad electrode 120P by the corresponding position of the second thickness region 359B and the pad electrode 120P to improve the following electrical connection between the pad electrode 120P and the second conductive layer (not shown in FIG. 15).

Figure 16:
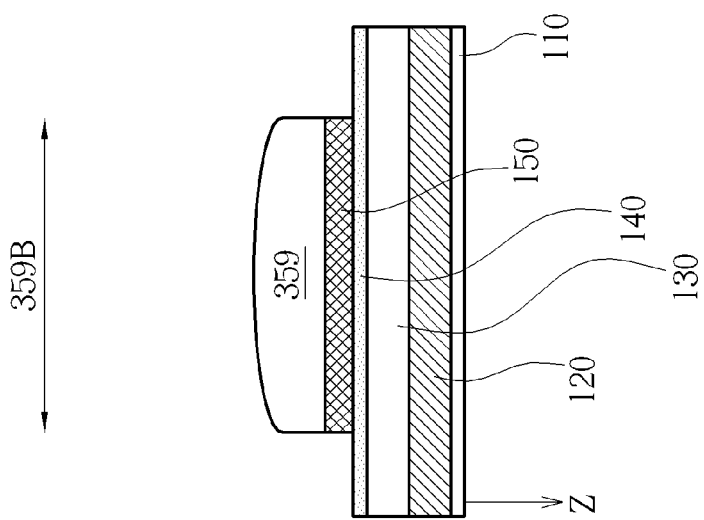
Figure 17:
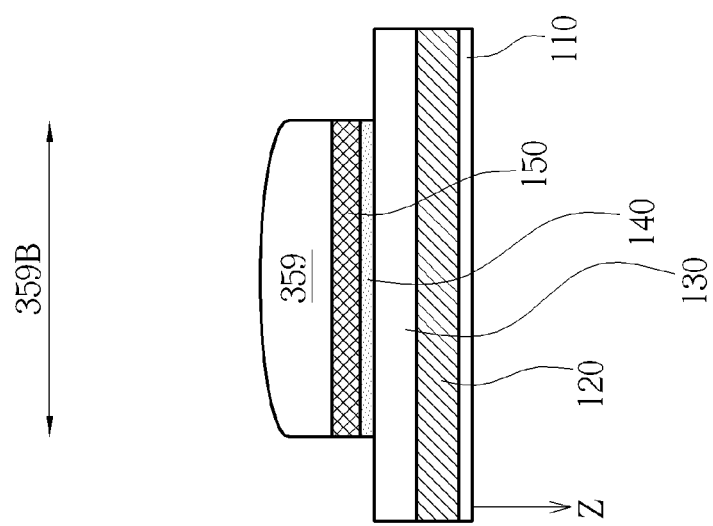
Figure 18:
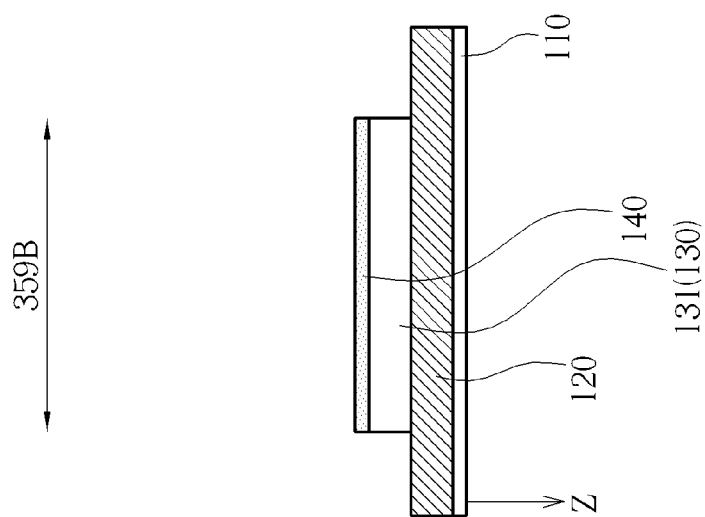

FIGS. 16-20 further depict the detailed steps of a manufacturing process of the second thickness region 359B. The first photolithography process in this embodiment is similar to the first preferred embodiment (please refer to FIGS. 2-6) except for the second thickness region 359B. As shown in FIG. 16 and FIG. 17, a first etching process is carried out in the second thickness region 359 to remove the etching stop layer 150 and the semiconductor layer 140 uncovered by the first patterned photoresist 359 by using the first patterned photoresist 359 as a mask, and to partially expose the gate insulating layer 130. As shown in FIG. 18, a second etching process is then carried out to etch the first patterned photoresist 359, the etching stop layer 150 and the gate insulating layer 130. Then the patterned gate insulating layer 131 is formed and the patterned gate insulating layer 131 partially exposes the first conductive layer 120. It is worth noting that since the first patterned photoresist 359 in the second thickness region 359B is relatively thinner, the first patterned photoresist 359 of the second thickness region 359B and its corresponding etching stop layer 150 can be removed in the second etching process to expose the semiconductor layer 140 in the second thickness region 359B. Oppositely, since the first patterned photoresist 359 in the first thickness region 359A is relatively thicker, it can remain in the first thickness region 359A to be employed in the following processes. Then, as shown in FIG. 19, the pad electrode 120P is formed through removing the first conductive layer 120 uncovered by the patterned gate insulating layer 131. As shown in FIG. 20, the semiconductor layer 140 in the second thickness region 359B is then removed to expose the patterned gate insulating layer 131 in the second thickness region 359B.

As shown in FIG. 21 and FIG. 22, a second and a third photolithography processes are carried out to respectively form a protective layer 160, a source electrode 171 and a drain electrode 172. An array substrate 301 is then formed. The second and the third photolithography processes in this embodiment are similar to those of the first preferred embodiment. It is worth noting that the patterned gate insulating layer 131 corresponding to the pad electrode 120P has been exposed in the first photolithography process, so that the patterned gate insulating layer 131 corresponding to the pad electrode 120P can be removed in the following second photolithography process by etching the patterned etching stop layer 151 to expose the pad electrode 120P and to allow the second conductive layer 170 formed through the third photolithography process to be electrically connected to the pad electrode 120P directly, and then to prevent the patterned gate insulating layer 131 from affecting the contact condition between the second conductive layer 170 and the pad electrode 120P. The disposition of the workpiece and the material characteristic of the array substrate 301 in this embodiment are similar to the array substrate 101 in the first preferred embodiment except that there is no patterned gate insulating layer 131 or patterned semiconductor layer 141 between the pad electrode 120P and the second conductive layer 170. In addition, it is worth noting that the regions illustrated in FIG. 22 respectively include a region R1, a region R2, a region R3, a region R4 and a region R5. The region R1 can be regarded as a thin film transistor region, and comprises a thin film transistor T1. The region R2 can be regarded as a capacitance region, and comprises a capacitance structure S3 composed of the first conductive layer 120, the gate insulating layer 130, the semiconductor layer 140, the second conductive layer 170 and the third conductive layer 180 (ex. a portion of the pixel electrode). The region R3 between the region R1 and region R2 can be regarded as a pixel region, and the pixel electrode 181 is electrically connected to the thin film transistor T1. More particularly, it comprises a first stacked structure S1 below the pixel electrode 181 in this embodiment, and the layer sequence of the first stacked structure S1 from bottom to top is the first conductive layer 120, the gate insulating layer 130, the semiconductor layer 140, the etching stop layer 150 the protective layer 160 and the second conductive layer 170. The region R4 can be regarded as a contact region or a connecting region, and comprises a connecting structure S10. The connecting structure S10 includes a first conductive layer 120, a second conductive layer 170 covering the first conductive layer 120 and contacting with the first conductive layer 120, and a portion of the third conductive layer 180 (ex. a portion of the pixel electrode), disposed on the second conductive layer 170. The region R5 can be regarded as a pad region, and comprises a pad electrode structure S11. The structure of the pad electrode S11 is similar to the connecting structure S10.

Figure 23:
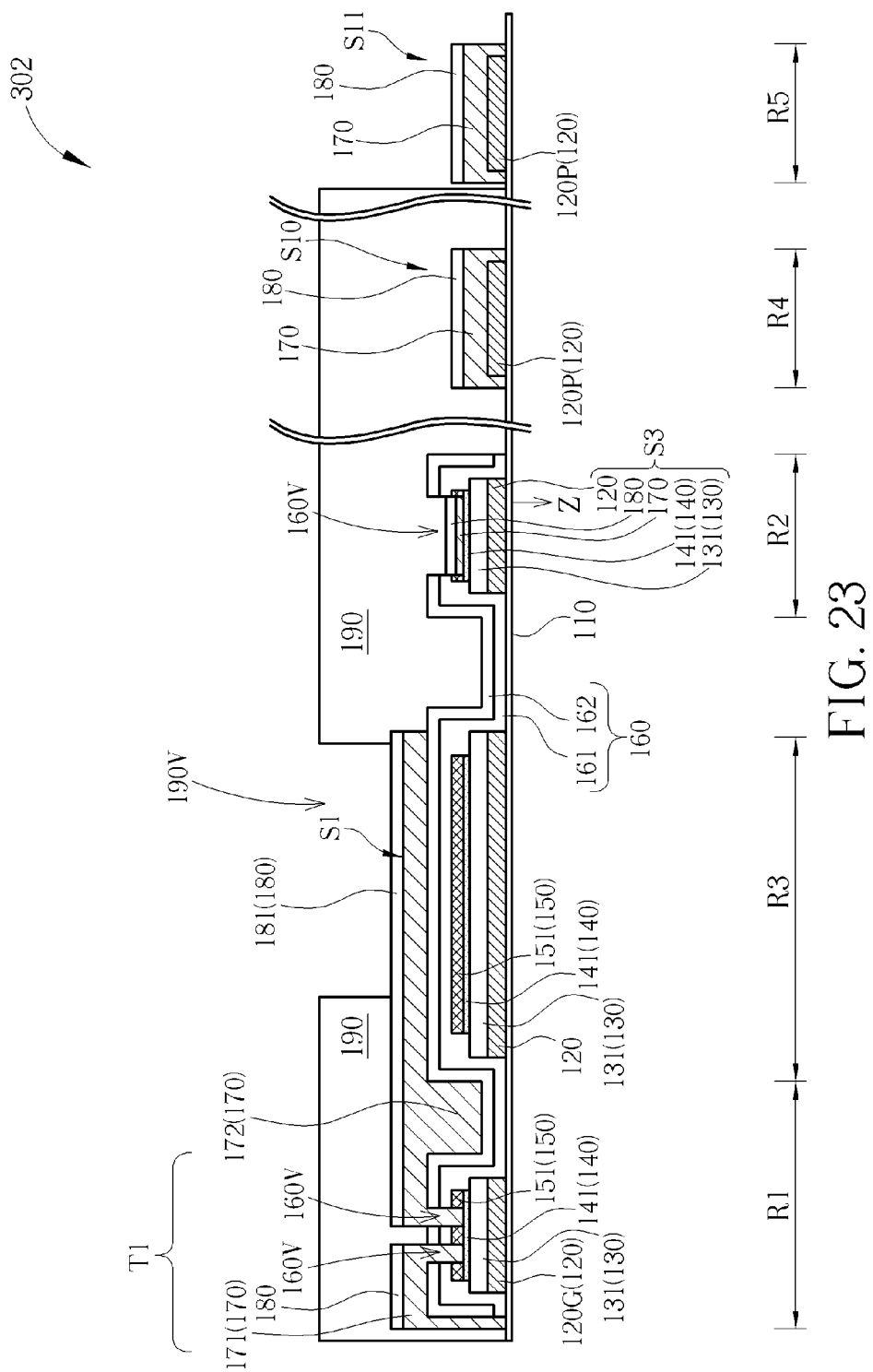
FIG. 23 is a schematic diagram illustrating a manufacturing method of an array substrate according to a sixth preferred embodiment.

Please refer to FIG. 23. FIG. 23 is a schematic diagram illustrating a manufacturing method of an array substrate according to a sixth preferred embodiment. As shown in FIG. 23, compared to the fifth preferred embodiment, the manufacturing method in this embodiment further comprises performing a fourth photolithography process to form an isolation layer 190 on the source electrode 171 and the drain electrode 172 after the third photolithography process, to at least partially cover the source electrode 171, the drain electrode 172, the third conductive layer 170 and the protective layer 160. An array substrate 302 is then formed. The isolation layer 190 can selectively partially cover the pad electrode 120P, the second conductive layer 170 and the third conductive layer 180 corresponding to the pad electrode 120P. The isolation layer 190 partially exposes the second conductive layer 170 and the third conductive layer 180 corresponding to the pad electrode 120P. Then an outside circuit, or an outside device (not shown), can be electrically connected to the array substrate 302 via the pad electrode 120P uncovered by the isolation layer 190. The disposition of the workpiece and the material characteristic of array substrate 302 in this embodiment are similar to those of the array substrate 301 in the fifth preferred embodiment, except that the array substrate 302 includes the isolation layer 190. Moreover, it is worth noting that the differences between the sixth preferred embodiment and the fifth preferred embodiment areas follows: in the sixth preferred embodiment, the region R1, the region R2 and the region R4 are all covered by the isolation layer 190, a portion of the region R3 is also covered by the isolation layer 190, but the region R5 is not covered by the isolation layer 190.

Figure 24:
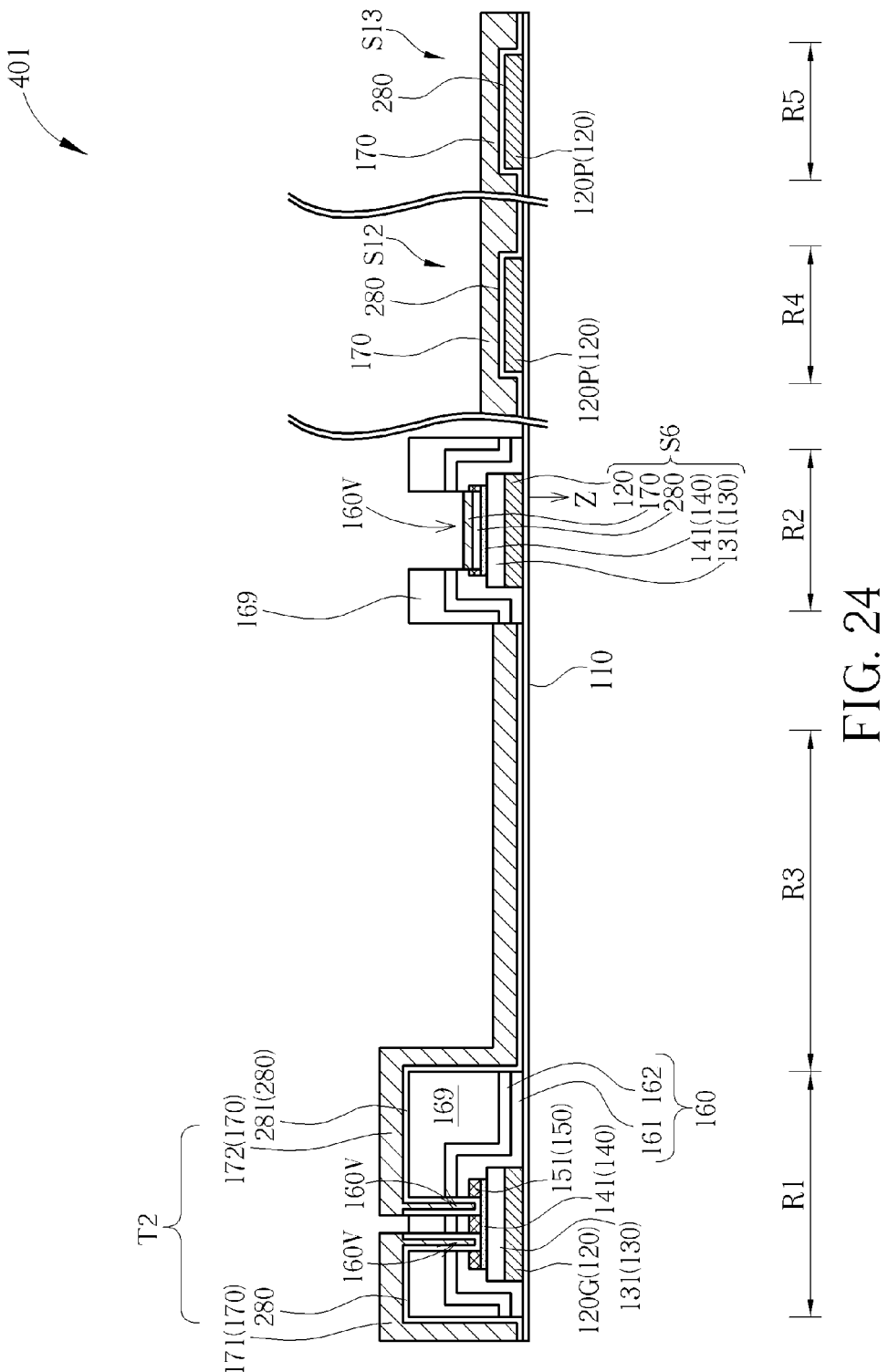
FIG. 24 is a schematic diagram illustrating a manufacturing method of an array substrate according to a seventh preferred embodiment.

Please refer to FIG. 24. FIG. 24 is a schematic diagram illustrating a manufacturing method of an array substrate according to a seventh preferred embodiment. As shown in FIG. 24, the manufacturing method of an array substrate in this embodiment is carried out by using the first photolithography process of the fifth preferred embodiment, and the second and the third photolithography processes of the third preferred embodiment so as to have the pad electrode 120P to be directly electrically connected to the second conductive layer 170 formed by the third photolithography process. Undesirable effects of the patterned gate insulating layer 131 on the contact condition between the second conductive layer 170 and the pad electrode 120P can be avoided. In other words, the disposition of the workpiece and the material characteristic of the array substrate 401 are similar to the array substrate 201 of the third preferred embodiment except that there are no patterned gate insulating layer 131 and the patterned semiconductor layer 141 disposed between the gap electrode 120 and the second conductive layer 170 in this embodiment.

It is worth noting that the regions illustrated in FIG. 24 respectively include a region R1, a region R2, a region R3, a region R4 and a region R5. The region R1 can be regarded as a thin film transistor region, and comprises a thin film transistor T2. The region R2 can be regarded as a capacitance region, which comprises a capacitance structure S6 composed of a first conductive layer 120, a gate insulating layer 130, a semiconductor layer 140, a second conductive layer 170 and a third conductive layer 180 (ex. a portion of the pixel electrode). More particularly, the stacked structure formed by the protective layer 160 and the second patterned photoresist 169 partially covers the capacitance structure S6. The region R3 between the region R1 and region R2 can be regarded as a pixel region that comprises a pixel electrode 281 electrically connected to the thin film transistor T2. More particularly, there are no stacked structures or film layers below the pixel electrode 281 in this embodiment, and the bottom surface of the pixel electrode 281 directly contacts the upper surface of the substrate 110. The region R4 can be regarded as a contact region or a connecting region of the first conductive layer 120 and the second conductive layer 170. The region R4 comprises a connecting structure S12. The connecting structure S12 includes the first conductive layer 120, a portion of the third conductive layer 280 (ex. a portion of the pixel electrode) covering the first conductive layer 120 and contacted with the first conductive layer 120, and the second conductive layer 170 disposed on the third conductive layer 280. The region R5 can be regarded as a pad region that comprises a pad electrode structure S13. The structure of the pad electrode S13 is similar to the connecting structure S12.

Figure 25:
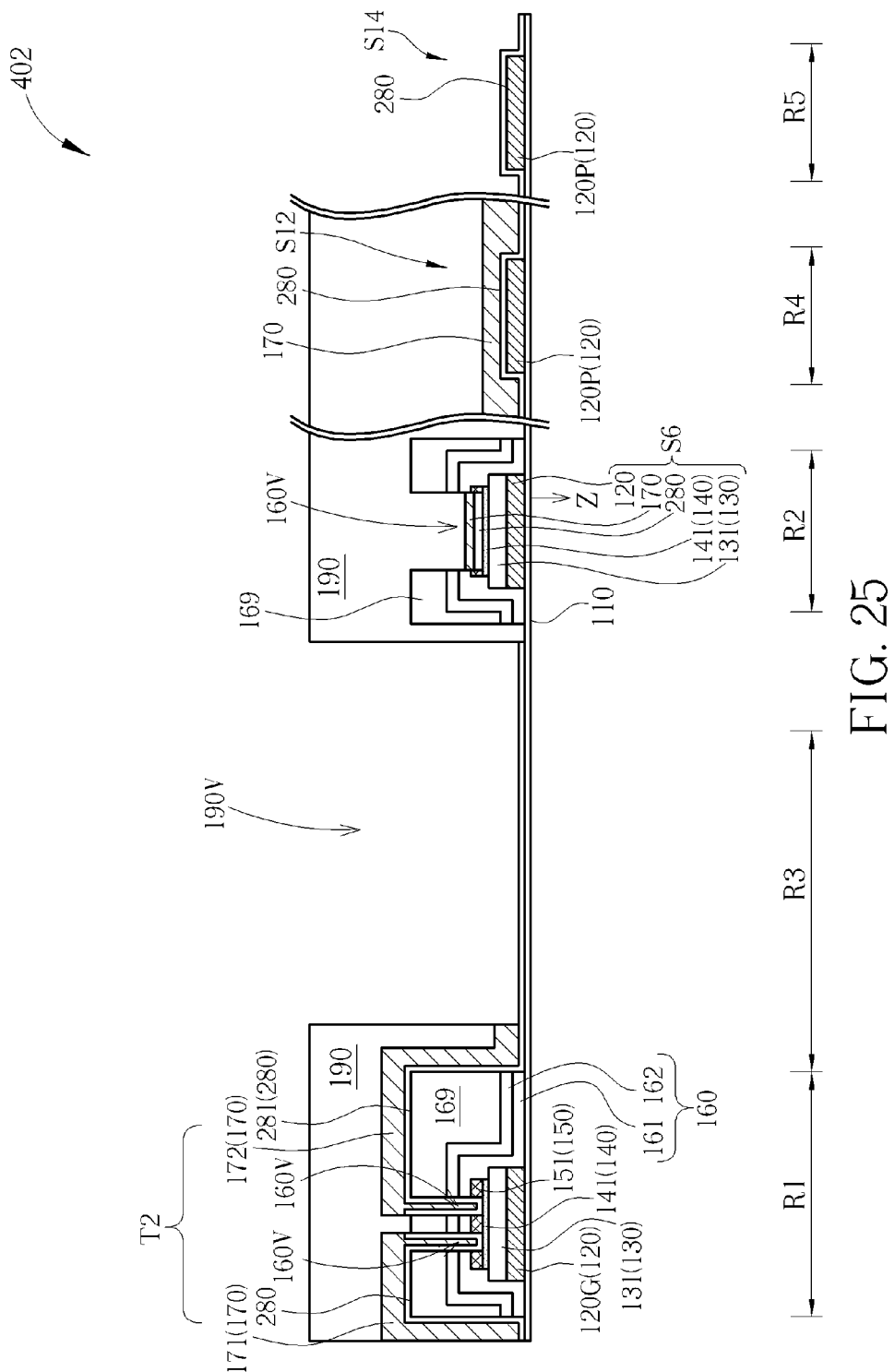
FIG. 25 is a schematic diagram illustrating a manufacturing method of an array substrate according to an eighth preferred embodiment.

Please refer to FIG. 25. FIG. 25 is a schematic diagram illustrating a manufacturing method of an array substrate according to an eighth preferred embodiment. As shown in FIG. 25, compared to the manufacturing method of an array substrate according to the seventh preferred embodiment, the manufacturing method in this embodiment further comprises performing a fourth photolithography process that is the same as the fourth photolithography process of the fourth preferred embodiment, in order to form an isolation layer 190 on the source electrode 171 and the drain electrode 172 after the third photolithography process, so as to at least partially cover the source electrode 171, the drain electrode 172 and the second patterned photoresist 169. The isolation layer 190 has a pixel opening 190V exposing the pixel electrode 281 and another opening exposing a portion of the pad electrode 120P and its corresponding third conductive layer 280. An array substrate 402 is then formed. In this embodiment, the pixel opening 190V can be called an effective pixel region, which is substantially equal to the above-mentioned pixel region in the third preferred embodiment. The isolation layer 190 can be a single layer or a multi-layer stacked structure, and the isolation layer 190 comprises one of the materials mentioned in the previous embodiments. The disposition and the material characteristic of the array substrate 402 in this embodiment are similar to the array substrate 401 in the seventh preferred embodiment, except for the array substrate 402, which comprises the isolation layer 190. The structure difference between the region R3 and the region R5 in the eighth preferred embodiment and the region R3 and the region R5 in the seventh preferred embodiment are described hereafter. There is no other film layer above or below the pixel electrode 281 in the effective pixel region in the region R3 of the eighth preferred embodiment; in other words, the bottom surface of the pixel electrode 281 directly contacts the upper surface of the substrate 110. But the region R3 in the seventh preferred embodiment is covered by the second conductive layer 170. And there is no second conductive layer 170 in the region R5 of the eighth preferred embodiment; in other words, a pad electrode structure S14 only includes the first conductive layer 120 and the third conductive layer 280 (ex. a portion of the pixel electrode) partially covering the first conductive layer 120, while the region R5 in the seventh preferred embodiment is also covered by the second conductive layer 170. Furthermore, the region R1, the region R2, the region R4 and a portion of the region R3 are covered by the isolation layer 190, but the region R5 is not covered by the isolation layer 190 in the eighth embodiment.

Figure 26:
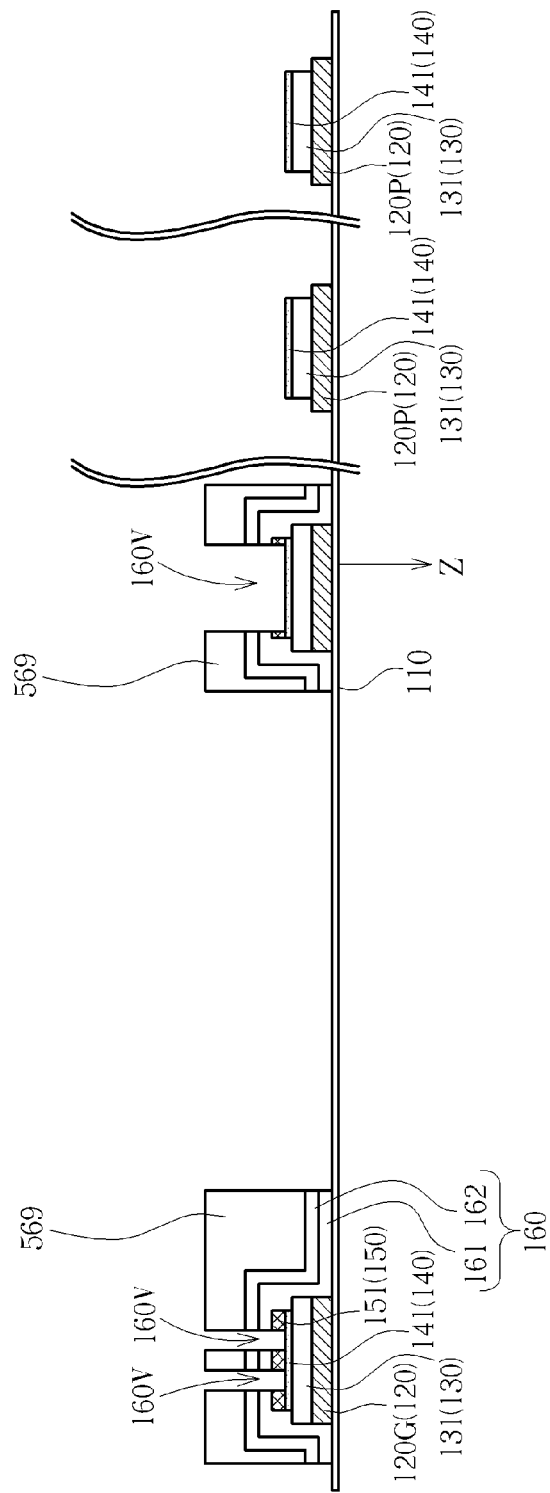
FIG. 26 and FIG. 27 are schematic diagrams illustrating a manufacturing method of an array substrate according to a ninth preferred embodiment.
Figure 27:
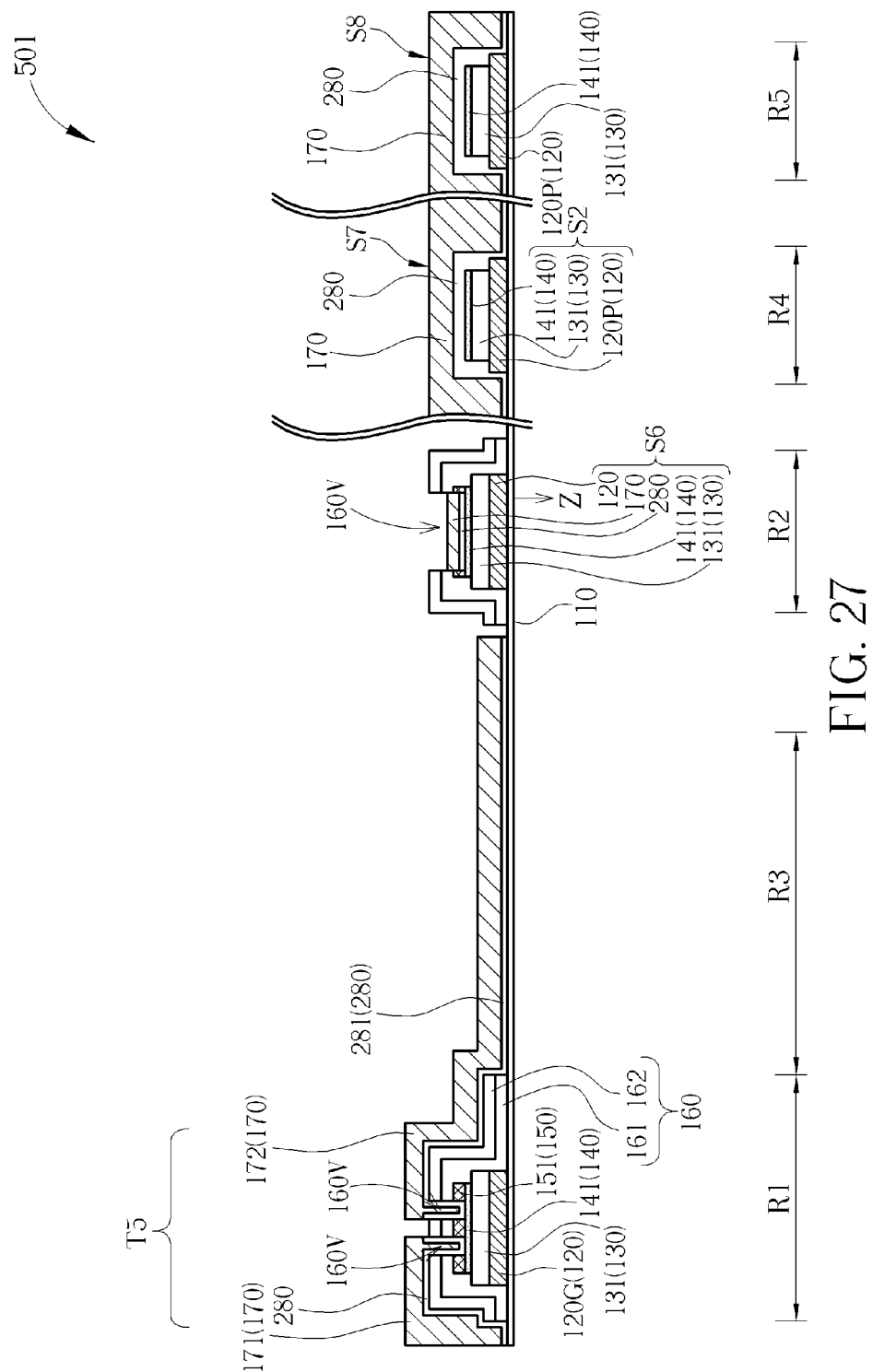

Please refer to FIG. 26 and FIG. 27. FIG. 26 and FIG. 27 are schematic diagrams illustrating a manufacturing method of an array substrate according to a ninth preferred embodiment. As shown in FIG. 26, a protective layer 160 is formed by using a second patterned photoresist 569 in the second photolithography process. As shown in FIG. 27, what is different from the third preferred embodiment is that the second patterned photoresist 569 is removed before the third photolithography process to make the source electrode 171 and the drain electrode 172 to be formed on the protective layer 160 and the substrate 110. A thin film transistor T5 and an array substrate comprising the thin film transistor T5 are accordingly formed. In addition, the array substrate 501 further comprises a pixel electrode 281 disposed between the protective layer 160 and the drain electrode 172. The difference with the array substrate 201 in the third preferred embodiment is that the pixel electrode is disposed on the protective layer 160 and the substrate 110 in this embodiment. The disposition of the workpiece and the material characteristic of the array substrate 501 in this embodiment are similar to those of the array substrate 201 in the third preferred embodiment, except that there is no second patterned photoresist 169 disposed on the array substrate 501 in this embodiment. It is worth noting that the regions illustrated in FIG. 27 respectively include a region R1, a region R2, a region R3, a region R4 and a region R5. The region R1 can be regarded as a thin film transistor region, which comprises a thin film transistor T5. The region R2 can be regarded as a capacitance region, which comprises a capacitance structure S6 composed of a first conductive layer 120, a gate insulating layer 130, a semiconductor layer 140, a second conductive layer 170 and a third conductive layer 280 (ex. a portion of the pixel electrode). More particularly, the protective layer 160 partially covers the capacitance structure S6. The region R3 between the region R1 and the region R2 can be regarded as a pixel region that comprises a pixel electrode 281 electrically connected to the thin film transistor T5. More particularly, there are no stacked structures or film layers below the pixel electrode 281 in this embodiment, and the bottom surface of the pixel electrode 281 directly contacts the upper surface of the substrate 110. The region R4 can be regarded as a contact region or a connecting region for the first conductive layer 120 and the second conductive layer 170, and it comprises a connecting structure S7. The connecting structure S7 includes a second stacked structure S2 (including the first conductive layer 120, the gate insulating layer 130 and the semiconductor layer 140), a portion of the third conductive layer 280 (ex. a portion of the pixel electrode) covering the second stacked structure S2 and partially contacting the first conductive layer 120, and the second conductive layer 170, which are disposed on the third conductive layer 280. The region R5 can be regarded as a pad region, which comprises a pad electrode structure S8. The structure of the pad electrode S8 is similar to the connecting structure S7.

Figure 28:
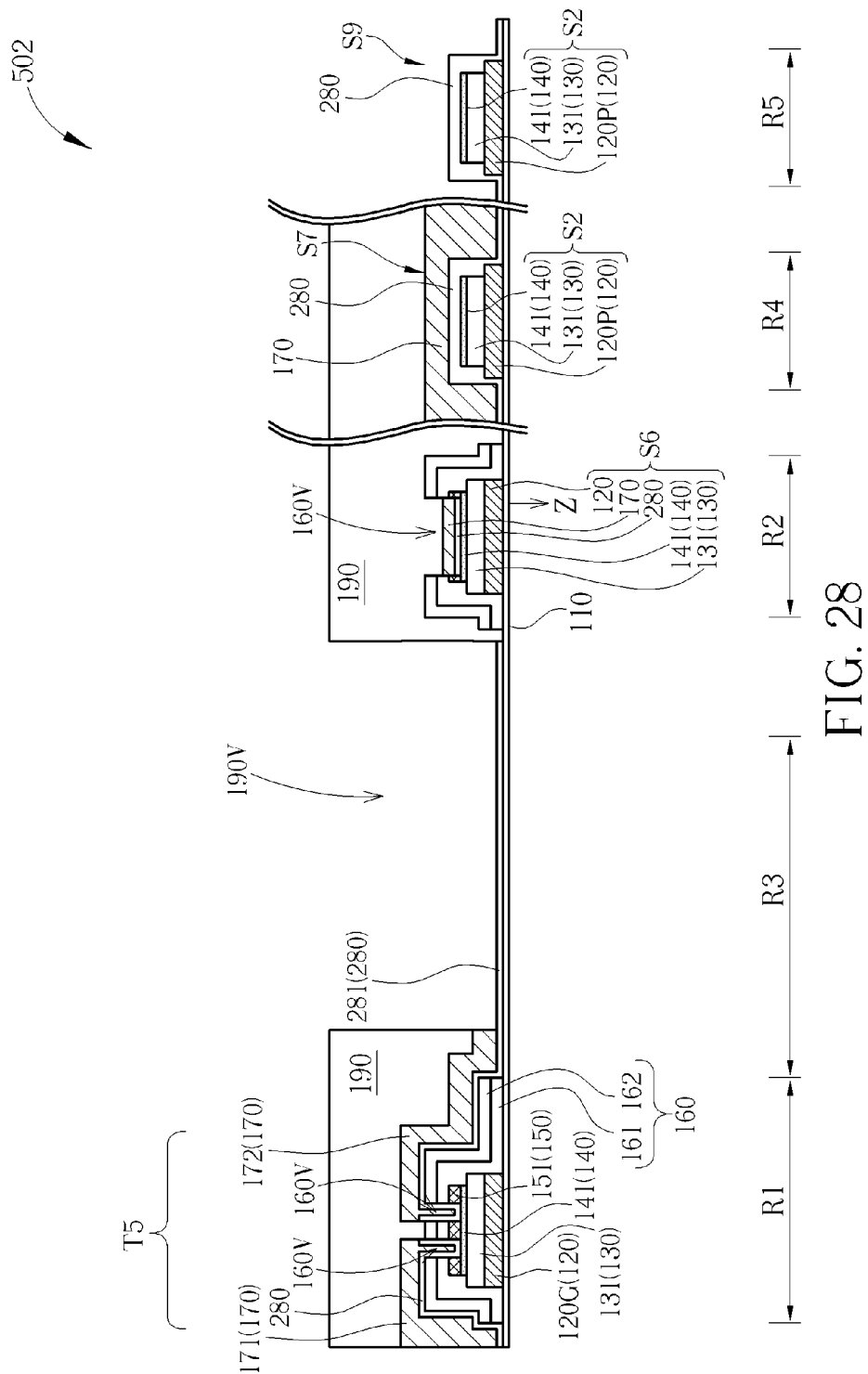
FIG. 28 is a schematic diagram illustrating a manufacturing method of an array substrate according to a tenth preferred embodiment.

Please refer to FIG. 28. FIG. 28 is a schematic diagram illustrating a manufacturing method of an array substrate according to a tenth preferred embodiment. As shown in FIG. 28, compared to the ninth preferred embodiment, the manufacturing method in this embodiment further comprises performing a fourth photolithography process to form an isolation layer 190 on the source electrode 171 and the drain electrode 172 after the third photolithography process, in order to at least partially cover the source electrode 171, the drain electrode 172, and the protective layer 160, thereby forming an array substrate 502. In addition, the fourth photolithography process further comprises removing the second conductive layer 170 uncovered by the isolation layer 190 to partially expose the pixel electrode 281 and the third conductive layer 280. Furthermore, the isolation layer 190 has a pixel opening 190V partially exposing the pixel electrode 281 and another opening exposing the third conductive layer 280 in the region R5. In this embodiment, the pixel opening 190V can be called an effective pixel region, which is substantially equal to the above-mentioned pixel region of the third preferred embodiment. The isolation layer 190 can be a single layer or a multi-layer stacked structure, which comprises one of the materials mentioned in said embodiment. The disposition and the material characteristic of the array substrate 502 in this embodiment are similar to those of the array substrate 501 in the ninth preferred embodiment, except that there is an isolation layer 190 on the array substrate 502. It is worth noting that the structure differences of the region R3 and the region R5 between the tenth preferred embodiment and the ninth preferred embodiment are described as follows. There is no other film layer above or below the pixel electrode 281 in the effective pixel region in the region R3 of the tenth preferred embodiment; in other words, the bottom surface of pixel electrode 281 directly contacts the upper surface of the substrate 110, whereas the region R3 in the ninth preferred embodiment is covered by the second conductive layer 170. And there is no second conductive layer 170 in the region R5 in the tenth preferred embodiment; in other words, the pad electrode structure S9 only includes the second stacked structure S2 (including the first conductive layer 120, the gate insulating layer 130 and the semiconductor layer 140) and a portion of the third conductive layer 280 (ex. a portion of the pixel electrode) covering the stacked structure S2 and partially contacting the first conductive layer 120. But the region R5 in the ninth preferred embodiment is also covered by the second conductive layer 170. Furthermore, the region R1, the region R2, the region R4 and a portion of the region R3 are covered by the isolation layer 190, whereas the region R5 is not covered by the isolation layer 190 in the tenth embodiment.

Figure 29:
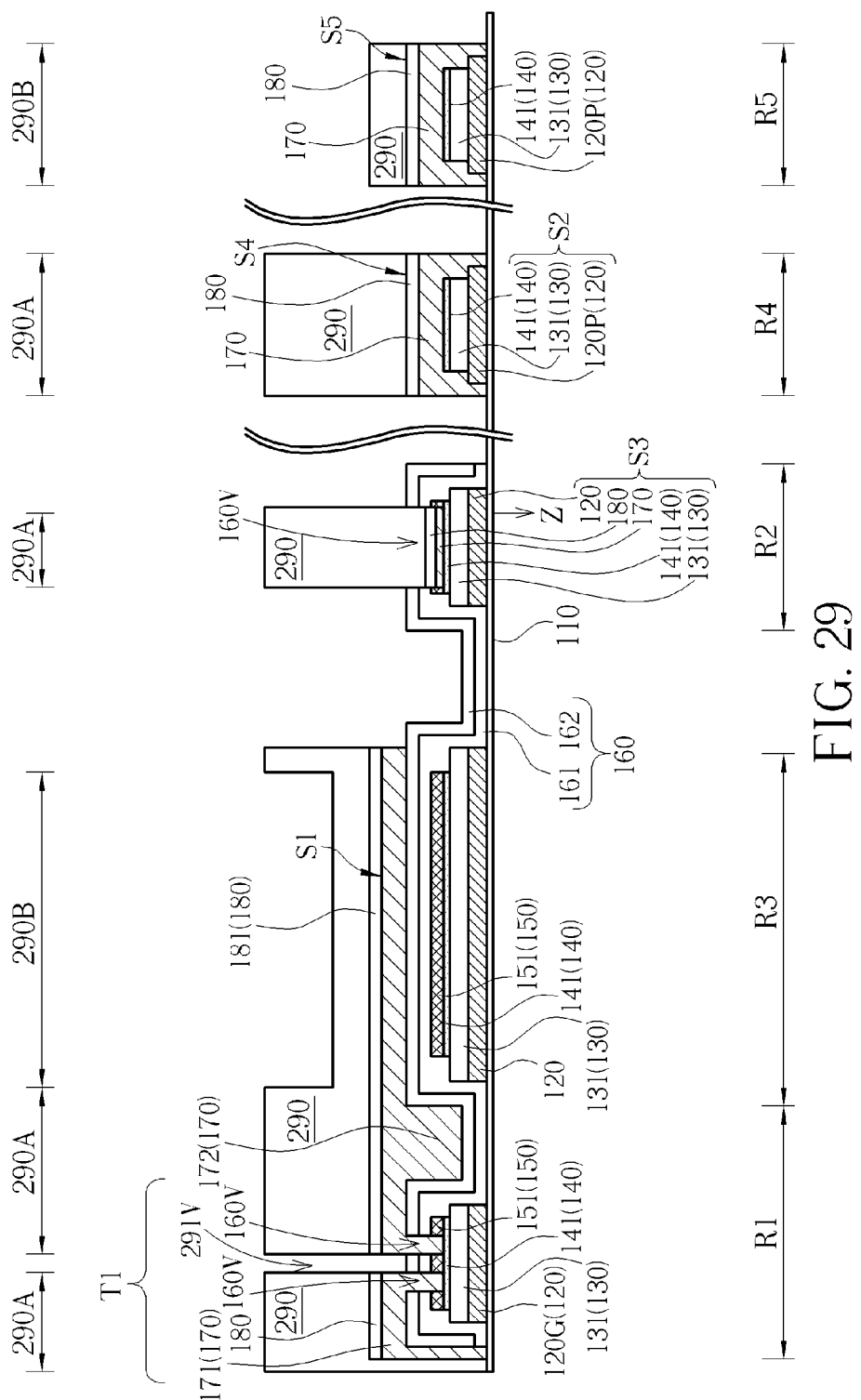
FIG. 29 and FIG. 30 are schematic diagrams illustrating a manufacturing method of an array substrate according to an eleventh preferred embodiment.
Figure 30:
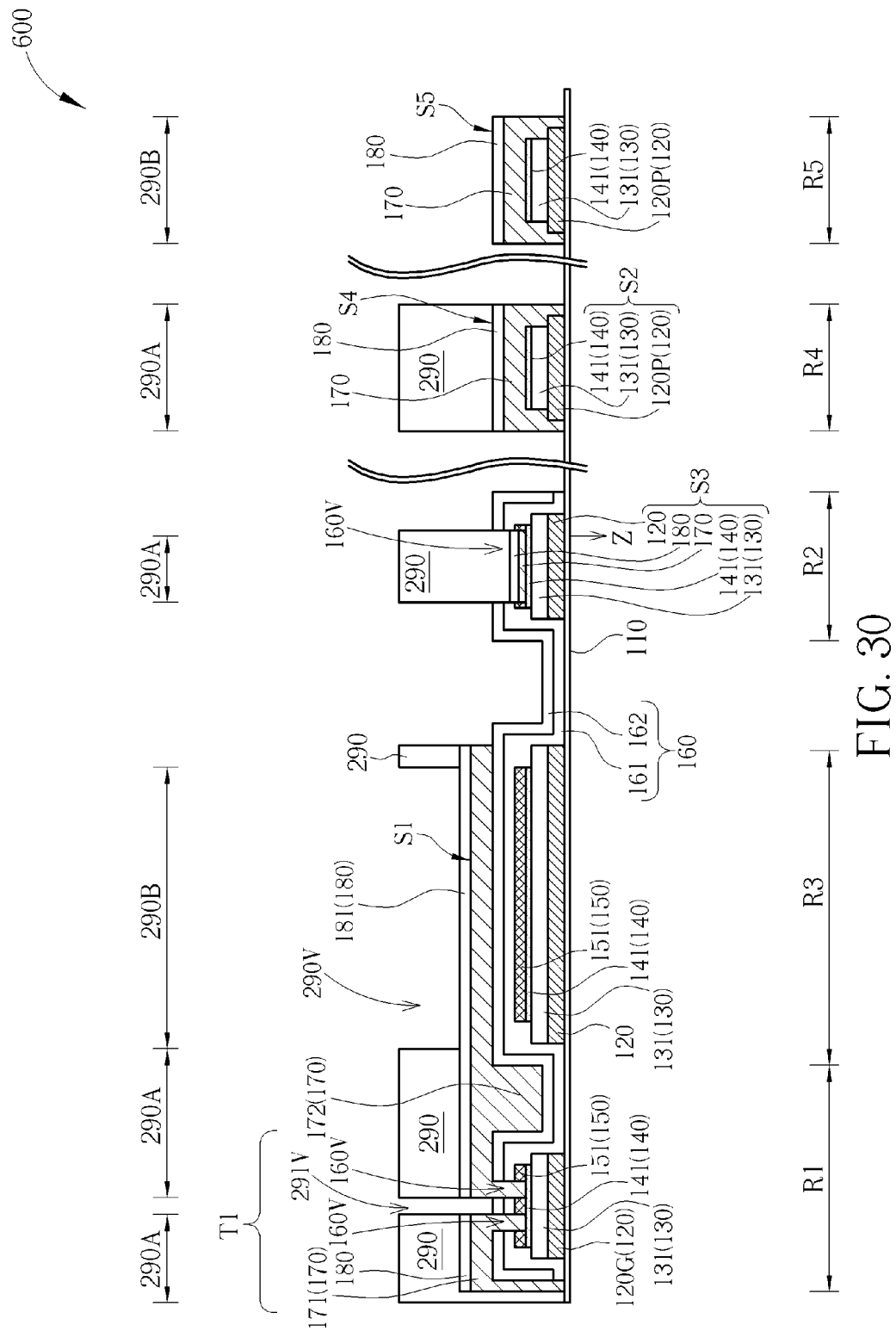

Please refer to FIG. 29 and FIG. 30, and also refer to FIGS. 1-7. FIG. 29 and FIG. 30 are schematic diagrams illustrating a manufacturing method of an array substrate according to an eleventh preferred embodiment. In this embodiment, the first photolithography process and the second photolithography process are similar to those in above-mentioned first preferred embodiment (shown in FIGS. 1-7). As shown in FIG. 29, the manufacturing method of an array substrate in this embodiment comprises performing a third photolithography process after the second photolithography process to form a source electrode 171 and a drain electrode 172 on the protective layer 160 and the patterned semiconductor layer 141. The source electrode 171 and the drain electrode 172 are respectively electrically connected to the patterned semiconductor layer 141 via different contact openings 160V. More precisely, the third photolithography process in this embodiment comprises the following steps. First, a second conductive layer 170 is formed to cover the protective layer 160 and the patterned semiconductor layer 141. Then, an isolation layer 290 can be formed on the second conductive layer 170, and the source electrode 171 and the drain electrode 172 are formed through an etching process using the isolation layer 290 as a mask, and then a thin film transistor T1 is formed on the substrate 110. In other words, in this embodiment, the source electrode 171 and the drain electrode 172 are defined by the isolation layer 290 in the third photolithography process. Furthermore, a third conductive layer 180 can also be optionally formed on the second conductive 170 before the isolation layer 290 is formed in the third photolithography process, and the source electrode 171 and the drain electrode 172 are formed by etching the second conductive layer 170 and the third conductive layer 180 using the isolation layer 290 as the mask. Then a pixel electrode 181 is formed on the drain electrode 172, but it is not limited thereto. The extended portion of the drain electrode 172 itself can act as a pixel electrode or the drain electrode 172 can be a bridge connecting a pixel electrode formed by other metal layers. In other words, the pixel electrode 181 can also be defined by the isolation layer 290 in the third photolithography process in this embodiment.

It is worth noting that the isolation layer 290 preferably has a first thickness region 290A and a second thickness region 290B, and a thickness of the isolation layer 290 in the second thickness region 290B is thinner than a thickness of the isolation layer 290 in the first region 290A. The isolation layer 290 in this embodiment preferably comprises photo patternable materials, such as photo patternable organic material, but not limited thereto. In other words, the isolation layer 290 can be formed through a photolithography process, but not limited thereto. In addition, the thickness difference between the first thickness region 290A and the second thickness region 290B is obtained by using a multi-tone photomask (not shown), and the multi-tone photomask has at least three different transmitting ratio regions, but the present disclosure is not limited to this. In other preferred embodiments of the present disclosure, other appropriate approaches may also be used to obtain the thickness difference between the isolation layer 290 in the first thickness region 290A and the isolation layer 290 in the second thickness region 290B.

As shown in FIG. 30, the manufacturing method of an array substrate in this embodiment further comprises removing the isolation layer 290 in the second thickness region 290B and forming a pixel opening 290V which partially exposes the pixel electrode 181, through a process such as an ashing process. Then an array substrate 600 can be formed by the above-mentioned steps. It is worth noting that the second thickness region 290B is preferably disposed correspondingly to the pixel electrode 181 and at least a portion of the pad electrode 120P in order to have the second conductive layer 170 and the third conductive layer 180 on the pad electrode 120P protected by the isolation layer 290 in the second thickness region 290B during the steps of forming the pixel electrode 181, the source electrode 171 and the drain electrode 172. The isolation layer 290 in the second thickness region 290 is removed to partially expose the second conductive layer 170 and the third conductive layer 180 corresponding to the pad electrode 120P, and an outside circuit or an outside device (not shown) can be electrically connected to the array substrate 600 by the portion of the pad electrode 120P uncovered by the isolation layer 290. In this embodiment, a process-simplified manufacturing method can be achieved by using the isolation layer 290 in the third photolithography process as a mask to define the pixel electrode 181, the source electrode 171 and the drain electrode 172. The difference between the array substrate 600 in this embodiment and the array substrate 102 in the second preferred embodiment is that there is an opening 291V in the isolation layer 290 in this embodiment, and the opening 291V at least partially exposes the thin film transistor T1. The disposition of the workpiece and the material characteristic of the array substrate 600 in this embodiment are similar to those of the array substrate 102 in the second preferred embodiment except for the isolation layer 290. It is worth noting that the difference in the regions R1-R4 between the eleventh preferred embodiment and the first preferred embodiment is that the isolation layer 290 is disposed on a portion of the stacked structure in the different regions (ex. the regions R1-R4), whereas the isolation layer 290 is not disposed in the region R5.

Figure 31:
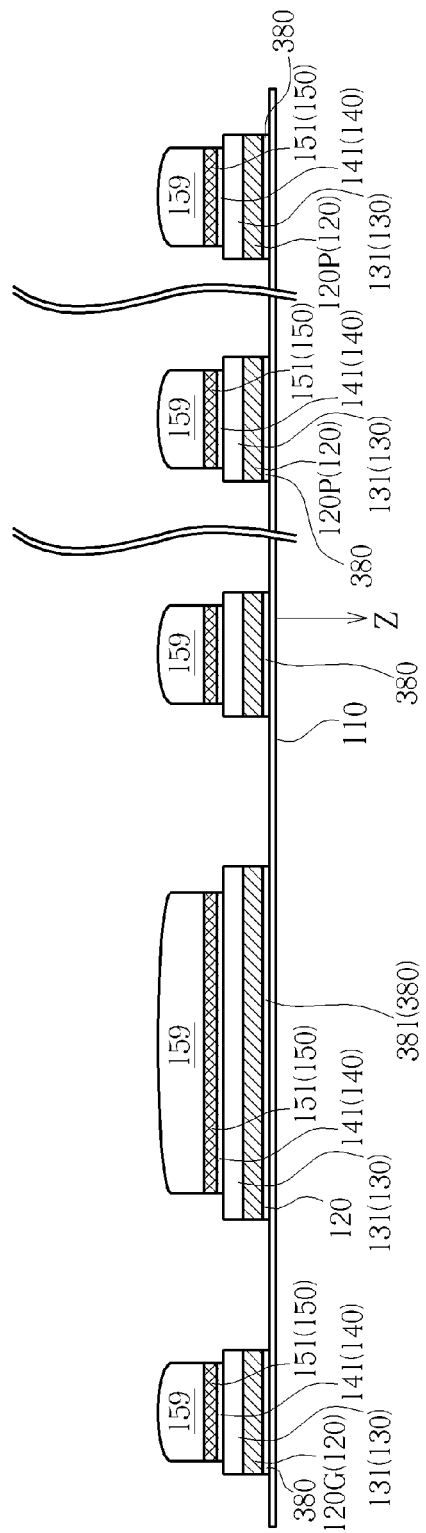
FIGS. 31-34 are schematic diagrams illustrating a manufacturing method of an array substrate according to a twelfth preferred embodiment.
Figure 32:
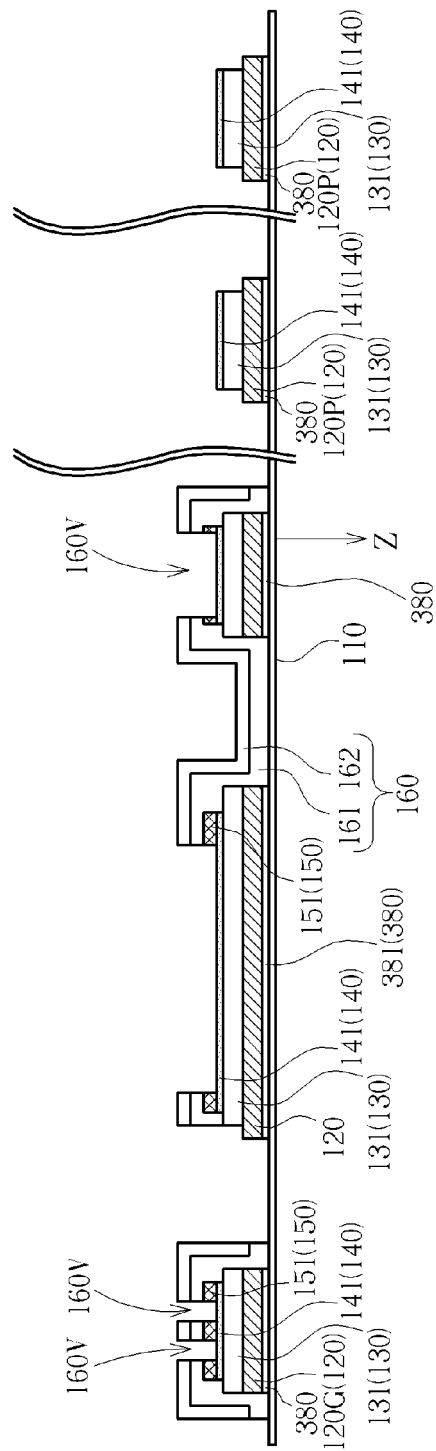
Figure 33:
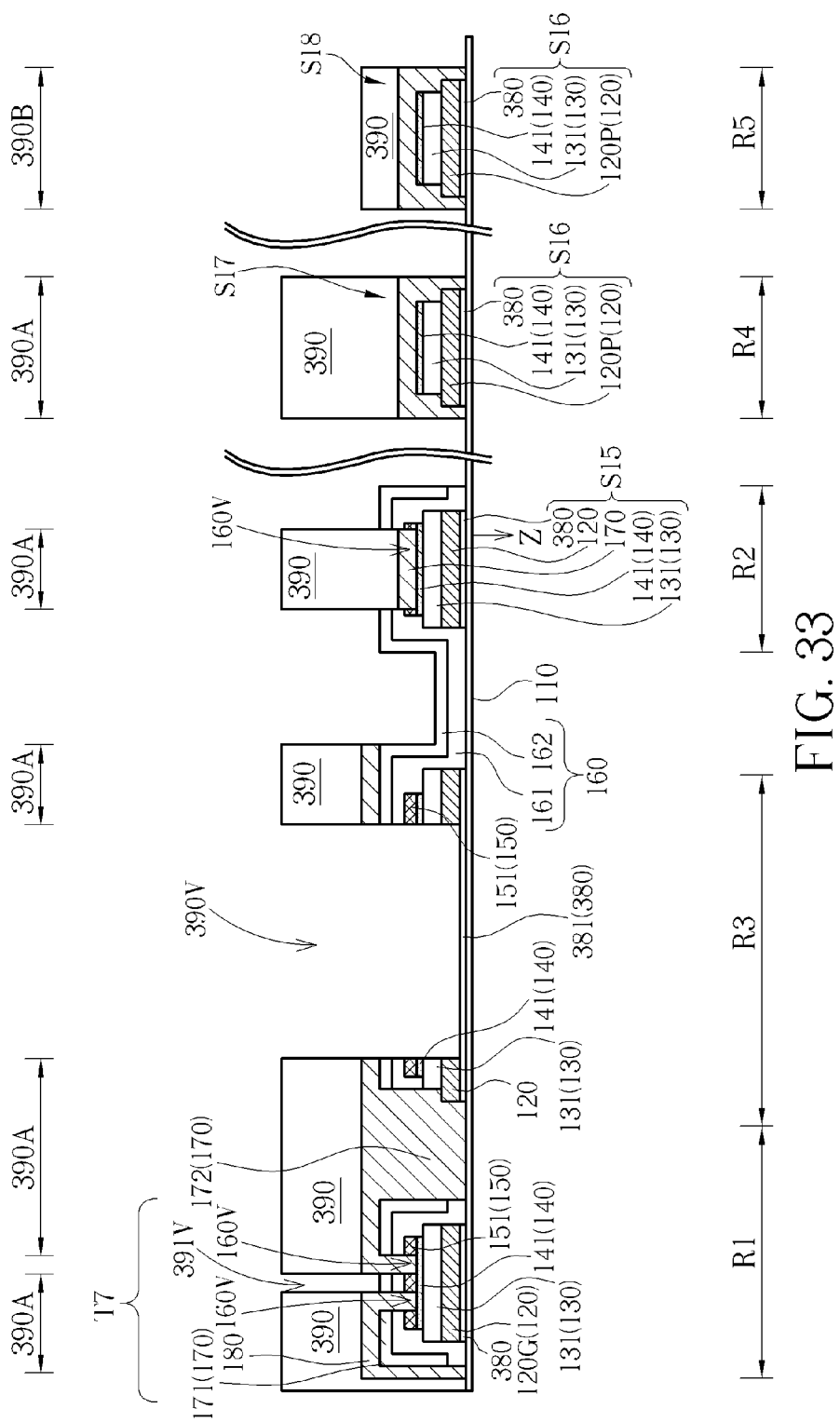
Figure 34:
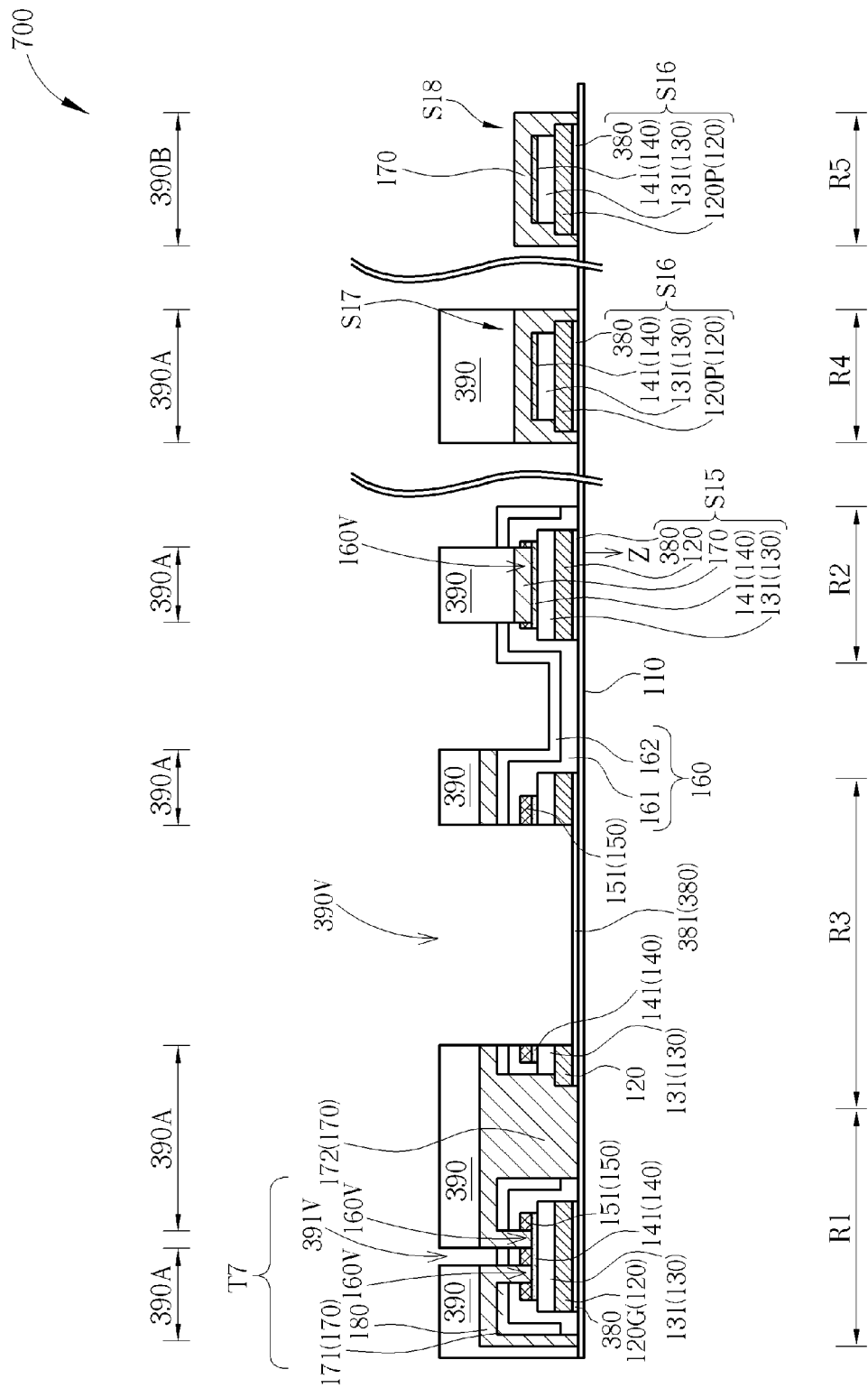

Please refer to FIGS. 31-34. FIGS. 31-34 are schematic diagrams illustrating a manufacturing method of an array substrate according to a twelfth preferred embodiment. FIG. 31 is a schematic diagram illustrating the first photolithography process according to this embodiment. FIG. 32 is a schematic diagram illustrating the second photolithography process according to this embodiment. FIGS. 33-34 are schematic diagrams illustrating the third photolithography process according to this embodiment. The manufacturing method of an array substrate according to this embodiment comprises the following steps. As shown in FIG. 31, a first photolithography process is first carried out. The difference between the first photolithography process of this embodiment and that of the first preferred embodiment is that the first photolithography process in this embodiment further comprises forming a transparent conductive layer 380 before the first conductive layer 120 is formed, and removing the transparent conductive layer 380 uncovered by a patterned gate insulating layer 131 to form a pixel electrode 381. The transparent conductive layer 380 preferably comprises a transparent conductive material such as ITO, IZO, AZO, a thin film metal or other appropriate transparent conductive materials. In addition, the pixel electrode 381 is preferably formed with the patterned semiconductor layer 141 at the same step, in order to simplify the process, but not limited thereto. The first photolithography process in this embodiment is similar to the one in the first preferred embodiment, except that a transparent conductive layer 380 and a pixel electrode 381 are formed in this embodiment.

As shown in FIG. 32, a second photolithography process is carried out after the first photolithography process in this embodiment. The difference between the second photolithography process of this embodiment and the one of the first preferred embodiment is that the second photolithography process in this embodiment further comprises removing at least a portion of the patterned gate insulating layer 131 on the pixel electrode 381 and at least partially exposing the first conductive layer 120 on the pixel electrode 381 to form a drain electrode (not shown in FIG. 32) that is electrically connected to the corresponding pixel electrode 381 through the exposed first conductive layer 120.

As shown in FIG. 33, a third photolithography process is carried out after the second photolithography process to form a source electrode 171 and a drain electrode 172 on the protective layer 160 and the patterned semiconductor layer 141. The source electrode 171 and the drain electrode 172 are respectively electrically connected to the patterned semiconductor layer 141 via the different contact openings 160V. More precisely, the third photolithography process in this embodiment comprises the following steps. First, a second conductive layer 170 is formed to cover the protective layer 160 and the patterned semiconductor layer 141. Then, an isolation layer 390 can be formed on the second conductive layer 170, and the source electrode 171 and the drain electrode 172 are formed by removing the second conductive layer 170 uncovered by the isolation layer 390. The drain electrode 172 can be electrically connected to the pixel electrode 381 by contacting the first conductive layer 120 corresponding to the pixel electrode 381. The third photolithography process in this embodiment further comprises removing the patterned semiconductor 141, the patterned gate insulating layer and the first conductive layer 120, which are at least partially uncovered by the isolation layer 390 on the pixel electrode 381, so as to at least partially expose the pixel electrode 381. Through the above-mentioned steps, a thin film transistor T7 can be formed on the substrate 110. In addition, the isolation layer 390 has a pixel opening 390V, and the pixel opening 390 at least partially exposes the pixel electrode 381. The pixel opening 390V can be called an effective pixel region, which is substantially equal to the below-mentioned pixel region. The isolation layer 390 in this embodiment preferably has a first thickness region 390A and a second thickness region 390B, and a thickness of the isolation layer 390 in the second thickness region 390B is thinner than a thickness of the isolation layer 390 in the first thickness region 390A. The isolation layer 390 in this embodiment preferably comprises photo patternable materials, such as photo patternable organic material, and the isolation layer 390 can be formed through a photo process which may include a coating process, an exposure process, and a developing process, but not limited thereto. In addition, the thickness difference between the isolation layer 390 in the first thickness region 390A and the isolation layer 390 in the second thickness region 390B is obtained by using a multi-tone photomask (not shown), and the multi-tone photomask has at least three different transmitting ratio regions, but the present disclosure is not limited to this. In other preferred embodiments of the present disclosure, other appropriate approaches may also be used to obtain the thickness difference between the isolation layer 390 in the first thickness region 390A and the isolation layer 390 in the second thickness region 390B.

Furthermore, it is worth noting that the regions illustrated in FIG. 33 respectively include a region R1, a region R2, a region R3, a region R4 and a region R5. The region R1 can be regarded as a thin film transistor region that comprises a thin film transistor T7. The region R2 can be regarded as a capacitance region that comprises a capacitance structure S15 composed of a first conductive layer 120, a gate insulating layer 130, a semiconductor layer 140, a second conductive layer 170 and a third conductive layer 380 (ex. a portion of the pixel electrode). More particularly, the protective layer 160 covers a portion of the capacitance structure S15, and the isolation layer 390 covers another portion of the capacitance structure S15. The region R3 between the region R1 and the region R2 can be regarded as a pixel region, which comprises a pixel electrode 381 electrically connected to the thin film transistor T7. More particularly, there is no stacked structure below the pixel electrode 381 in this embodiment, and the bottom surface of the pixel electrode 381 directly contacts the upper surface of the substrate 110. It is worth noting that there is a stacked structure above the pixel electrode 381, and the layer sequence from bottom to top comprises the transparent conductive layer 380, the first conductive layer 120, the gate insulating layer 130, the semiconductor layer 140, the etching stop layer 150, the protective layer 160, the second conductive layer 170 and a portion of the isolation layer 390. The region R4 can be regarded as a contact region or a connecting region of the first conductive layer 120 and the second conductive layer 170, which comprises a connecting structure S17. The connecting structure S17 includes a second stacked structure S16 (including the transparent conductive layer 380, the first conductive layer 120, the gate insulating layer 130 and the semiconductor layer 140), the second conductive layer covering the second stacked structure S16 and partially in contact with the first conductive layer 120, and a portion of the isolation layer disposed on the second conductive layer 170. The region R5 can be regarded as a pad region, which comprises a pad electrode structure S18. The structure of the pad electrode S18 is similar to the connecting structure S7. But the thickness of the isolation layer 390 disposed on the second stacked structure S16 in the region R5 is thinner than the thickness of the isolation layer 390 in other regions.

As shown in FIG. 34, the manufacturing method of an array substrate in this embodiment further comprises performing a process, such as an ashing process, to remove the isolation layer 390 in the second thickness region 390B, and to expose the second conductive layer 170 corresponding to the pad electrode 102P in the second thickness region 390B. It is worth noting that what differs from above-mentioned embodiments is that the array substrate 700 comprises the pixel electrode 381 disposed between the substrate 110 and the drain electrode 172. In addition, the isolation layer 390 has a pixel opening 390V, an opening 391V and another opening. The opening 391V at least partially exposes the thin film transistor, and the other opening exposes the most right-hand-side second conductive layer 170 in FIG. 34. The array substrate 700 can be applied in a bottom emission organic electroluminescent display, but not limited thereto. Furthermore, the difference between the region R5 in the cross-sectional views FIG. 34 and FIG. 33 is that there is no isolation layer 390 disposed on the pad electrode S18 in FIG. 34, but there is an isolation layer disposed on the pad electrode S18 in FIG. 33 and its thickness is thinner than the thickness of the isolation layer 390 in the other regions.

To summarize the above descriptions, in the present disclosure, the manufacturing method of an array substrate integrates the manufacturing steps of the gate electrode, the semiconductor layer and the etching stop layer to simplify the manufacturing process and reduce the number of photomasks used. A patterned photoresist with different thicknesses in different regions is also used to remove the patterned gate insulating layer on the pad electrode, and to prevent the patterned gate insulating layer from affecting the contact condition of the other conductive layers and the pad electrode. Then the yield of the product can be improved. Furthermore, an isolation layer is used to define the source electrode and the drain electrode to further simplify the manufacturing process and reduce the number of photomasks used.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of an array substrate, comprising:
   providing a substrate;
   performing a first photolithography process, wherein the first photolithography process comprises:
      forming a first conductive layer, a gate insulating layer, a semiconductor layer and an etching stop layer on the substrate sequentially, and forming a first patterned photoresist on the etching stop layer;
      performing a first etching process to remove the etching stop layer and the semiconductor layer uncovered by the first patterned photoresist, and to partially expose the gate insulating layer;
      performing a second etching process to form a patterned gate insulating layer and a patterned etching stop layer by etching the first patterned photoresist, the etching stop layer and the gate insulating layer, and to partially expose the first conductive layer and the semiconductor layer;
      removing the first conductive layer uncovered by the patterned gate insulating layer to form a gate electrode; and
      removing the semiconductor layer uncovered by the patterned etching stop layer to form a patterned semiconductor layer, and to partially expose the patterned gate insulating layer; and
   performing a second photolithography process, wherein the second photolithography process comprises:
      forming a protective layer, wherein the protective layer at least partially covers the substrate and the patterned etching stop layer; and
      removing the patterned etching stop layer uncovered by the protective layer to at least partially expose the patterned semiconductor layer.

2. The manufacturing method of the array substrate according to claim 1, wherein the first photolithography process further comprises removing the first conductive layer uncovered by the patterned gate insulating layer to form a pad electrode.

3. The manufacturing method of the array substrate according to claim 2, wherein the second photolithography process further comprises removing the patterned gate insulating layer uncovered by the patterned semiconductor layer to at least partially expose the pad electrode.

4. The manufacturing method of the array substrate according to claim 1, further comprising performing a third photolithography process to form a source electrode and a drain electrode on the protective layer and the patterned semiconductor layer.

5. The manufacturing method of the array substrate according to claim 4, further comprising:
forming a pixel electrode on the drain electrode through the third photolithography process; and
performing a fourth photolithography process to form an isolation layer on the pixel electrode, wherein the isolation layer has a pixel opening, and the pixel opening at least partially exposes the pixel electrode.

6. The manufacturing method of the array substrate according to claim 4, further comprising:
forming a pixel electrode between the drain electrode and the protective layer through the third photolithography process; and
performing a fourth photolithography process to form an isolation layer on the pixel electrode, wherein the isolation layer has a pixel opening, and the pixel opening at least partially exposes the pixel electrode.

7. The manufacturing method of the array substrate according to claim 4, wherein the third photolithography process comprises forming an isolation layer, so the source electrode and the drain electrode are defined by the isolation layer.

8. The manufacturing method of the array substrate according to claim 7, wherein the third photolithography process further comprises using the isolation layer to define a pixel electrode.

9. The manufacturing method of the array substrate according to claim 7, wherein the isolation layer has a first thickness region and a second thickness region, and a thickness of the isolation layer in the second thickness region is thinner than a thickness of the isolation layer in the first thickness region.

10. The manufacturing method of the array substrate according to claim 9, further comprising removing the isolation layer in the second thickness region to form a pixel opening.

11. The manufacturing method of the array substrate according to claim 1, wherein the first patterned photoresist has a first thickness region and a second thickness region, and a thickness of the first patterned photoresist in the second thickness region is thinner than a thickness of the first patterned photoresist in the first thickness region.

12. The manufacturing method of the array substrate according to claim 11, wherein the first patterned photoresist in the second thickness region and the corresponding etching stop layer in the second thickness region are removed in the second etching process.

13. The manufacturing method of the array substrate according to claim 1, wherein the first photolithography process further comprises:
forming a transparent conductive layer on the substrate before forming the first conductive layer; and
removing the transparent conductive layer uncovered by the patterned gate insulating layer to form a pixel electrode.

14. The manufacturing method of the array substrate according to claim 13, further comprising performing a third photolithography process to form a source electrode and a drain electrode on the protective layer and the patterned semiconductor layer, wherein the third photolithography process comprises:
forming a second conductive layer to cover the protective layer and the patterned semiconductor layer;
forming an isolation layer on the second conductive layer;
removing the second conductive layer uncovered by the isolation layer to form the source electrode and drain electrode; and
removing at least a portion of the patterned gate insulating layer and the first conductive layer uncovered by the isolation layer to at least partially expose the pixel electrode.

15. The manufacturing method of the array substrate according to claim 1, wherein the semiconductor layer comprises an oxide semiconductor material, an amorphous silicon semiconductor material or a poly silicon semiconductor material.

* * * * *